US009383410B2

(12) United States Patent
Whetsel

(10) Patent No.: US 9,383,410 B2
(45) Date of Patent: *Jul. 5, 2016

(54) INVERTED TCK ACCESS PORT SELECTOR HAVING RESETS SELECTING ONE TAP

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/625,378

(22) Filed: Feb. 18, 2015

(65) Prior Publication Data

US 2015/0160295 A1 Jun. 11, 2015

Related U.S. Application Data

(62) Division of application No. 13/891,840, filed on May 10, 2013, now Pat. No. 8,990,649, which is a division of application No. 13/628,802, filed on Sep. 27, 2012, now Pat. No. 8,468,406, which is a division of (Continued)

(51) Int. Cl.
*G01R 31/3185* (2006.01)
*G01R 31/3177* (2006.01)

(52) U.S. Cl.
CPC .... *G01R 31/318533* (2013.01); *G01R 31/3177* (2013.01)

(58) Field of Classification Search
CPC ............... G01R 31/318555; G01R 31/318547; G01R 31/318572; G01R 31/318533; G01R 31/3177; G01R 31/318544; G01R 31/318558; G01R 31/2851; G01R 31/318563; G06F 11/27
USPC .......................... 714/726, 727, 729, 731, 733
See application file for complete search history.

(56) References Cited

U.S. PATENT DOCUMENTS 6,385,749 B1 * 5/2002 Adusumilli .... G01R 31/318563 714/30
6,408,413 B1 * 6/2002 Whetsel ......... G01R 31/318555 714/727
7,010,722 B2 * 3/2006 Jahnke ................ G06F 11/2242 324/750.3

(Continued)

OTHER PUBLICATIONS

Mukherjee, D.; Pedram, M.; Breuer, M.;, "Control strategies for chip-based DFT/BIST hardware," Test Conference, 1994. Proceedings., International, vol., No., pp. 893-902, Oct. 2-6, 1994.*

(Continued)

*Primary Examiner* — Cynthia Britt
(74) *Attorney, Agent, or Firm* — Lawrence J. Bassuk; Frank D. Cimino

(57) ABSTRACT

The disclosure describes a novel method and apparatuses for allowing a controller to select and access different types of access ports in a device. The selecting and accessing of the access ports is achieved using only the dedicated TDI, TMS, TCK, and TDO signal terminals of the device. The selecting and accessing of device access ports can be achieved when a single device is connected to the controller, when multiple devices are placed in a daisy-chain arrangement and connected to the controller, or when multiple devices are placed in a addressable parallel arrangement and connected to the controller. Additional embodiments are also provided and described in the disclosure.

5 Claims, 28 Drawing Sheets

Related U.S. Application Data application No. 13/272,697, filed on Oct. 13, 2011, now Pat. No. 8,301,946, which is a division of application No. 12/880,527, filed on Sep. 13, 2010, now Pat. No. 8,065,578.

(60) Provisional application No. 61/242,191, filed on Sep. 14, 2009.

(56) References Cited

U.S. PATENT DOCUMENTS

| | | | | |
|---|---|---|---|---|
| 7,397,274 B1* | 7/2008 | Tang | ............ | G01R 31/318516 326/16 |
| 8,065,578 B2* | 11/2011 | Whetsel | ............ | G01R 31/3177 714/729 |
| 8,301,946 B2* | 10/2012 | Whetsel | ............ | G01R 31/3177 714/729 |
| 8,468,406 B2* | 6/2013 | Whetsel | ............ | G01R 31/3177 714/729 |
| 8,990,649 B2* | 3/2015 | Whetsel | ............ | G01R 31/3177 714/727 |
| 2008/0091989 A1* | 4/2008 | Bakhshi | ............ | G11C 29/26 714/718 |
| 2008/0281547 A1* | 11/2008 | Nakamura | ....... | G01R 31/31855 702/120 |

OTHER PUBLICATIONS

"IEEE Standard for Reduced-Pin and Enhanced-Functionality Test Access Port and Boundary-Scan Architecture," IEEE Std 1149.7-2009, vol., No., pp. cl-985, Feb. 10, 2010.*

IEEE Standard Test Access Port and Boundary Scan Architecture, in IEEE Std 1149.1-2001 , vol., No., pp. 1-212, Jul. 23, 2001.*

* cited by examiner

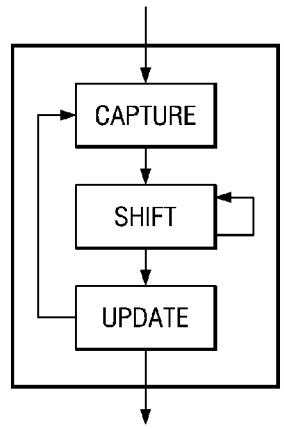 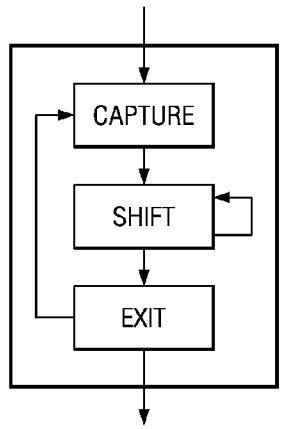 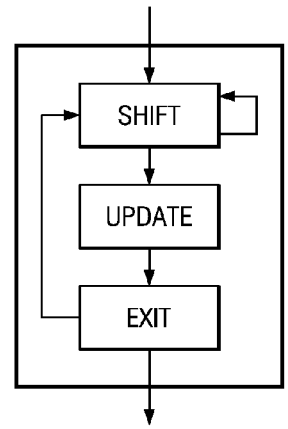
*FIG. 23A*     *FIG. 23B*     *FIG. 23C*
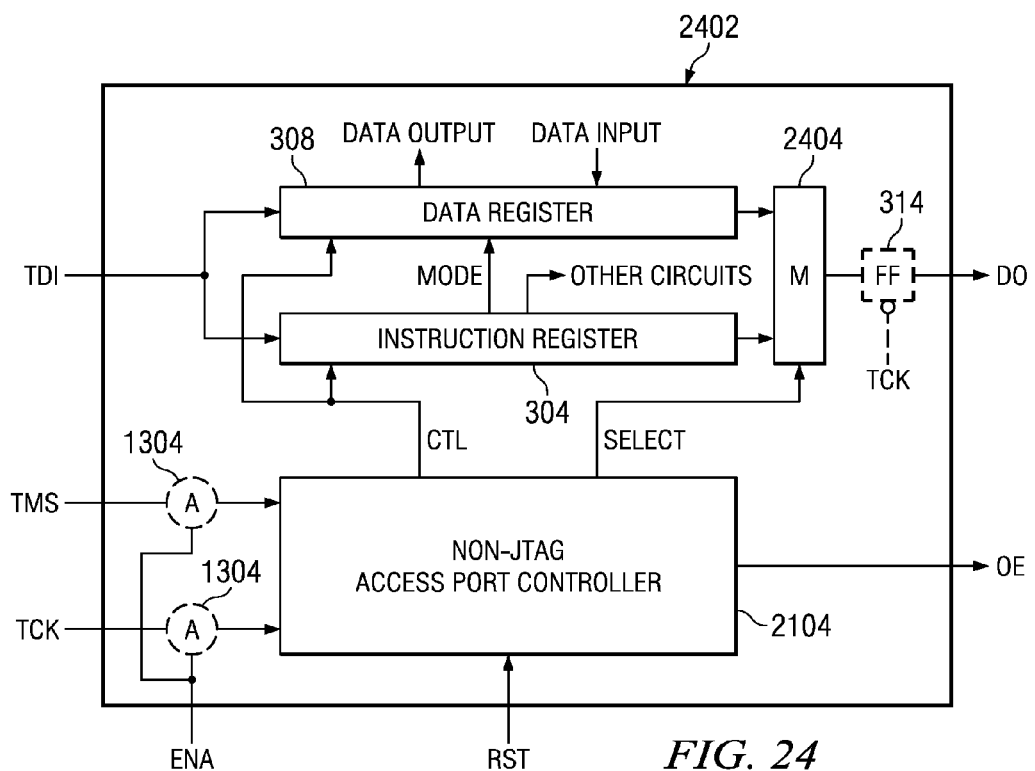
*FIG. 24*

INVERTED TCK ACCESS PORT SELECTOR HAVING RESETS SELECTING ONE TAP

This application is a divisional of application Ser. No. 13/891,840, filed May 10, 2013, now U.S Pat. No. 8,990,649, issued Mar. 24, 2015;

Which was a divisional of application Ser. No. 13/628,802, filed Sep. 27, 2012, now U.S. Pat. No. 8,468,406, issued Jun. 18, 2013;

Which is a divisional of application Ser. No. 13/272,697, filed Oct. 13, 2011, 8,301,946, granted Oct. 30, 2012;

Which is a divisional of application Ser. No. 12/880,527, filed Sep. 13, 2010, now U.S. Pat. No. 8,065,578, granted Nov. 22, 2011;

Which claims priority from Provisional Application No. 61/242,191, filed Sep. 14, 2009.

FIELD OF THE DISCLOSURE

This disclosure relates to a method and apparatus for allowing the external interface signals of a device's 1149.1 Test Access Port to be re-used as interface signals to other types of access ports within the device.

BACKGROUND OF THE DISCLOSURE

Many electrical devices today, which may be ICs or embedded cores within ICs, include a JTAG (IEEE 1149.1) Test Access Port to provide access to test, debug, emulation, and/or programming circuitry within the device. One thing that makes the JTAG Test Access Port attractive for use in a device is that its interface signals, consisting of a Test Data Input (TDI), Test Mode Select (TMS), Test Clock (TCK) and Test Data Output (TDO), are dedicated and therefore available for use at any stage of the device's lifetime, i.e. manufacturing through end use in a system. Since the JTAG Test Access Port became an IEEE standard in 1990, other IEEE standards (IEEE 1149.4, IEEE 1149.6 and IEEE 1532) have been developed based on the JTAG Test Access Port and signal interface. These other IEEE standards are compliant to the rules in the JTAG Test Access Port standard to insure interoperability between a device incorporating the JTAG Test Access Port standard and a device incorporating the other standards.

During development of the JTAG standard it was anticipated that the dedicated Test Access Port interface signals mentioned above may need to be used for testing purposes that are not compliant to the JTAG standard. To prepare for this possibility, the JTAG standard set forth rules and permissions in the standard to allow a compliance enable pattern to be input to a device, via additional signal inputs, to enable the JTAG interface signals to be used for other testing purposes.

The present disclosure provides a method and apparatus for allowing a device's JTAG interface signals to be selectively used for; (1) accessing the device's JTAG Test Access Port, (2) accessing JTAG compliant Access Ports, (3) accessing JTAG compatible Access Ports, and (4) accessing non-JTAG Access Ports. Advantageously, the access port selection method and apparatus of the disclosure is achieved using only the JTAG standard interface signals TDI, TMS, TCK and TDO.

FIG. 1 illustrates a first example of a standard JTAG Test Access Port (TAP) 102 in a device 104. The JTAG TAP includes a TDI input, a TMS input, a TCK input, an optional TRST input, a TDO output, and an output enable (OE) output. TDI inputs data to the TAP, TMS inputs control to the TAP, TCK inputs clocks to the TAP, and TDO outputs data from the TAP. The OE output is used to enable a device output buffer to output the TDO output from the TAP whenever the TAP is in the Shift-DR or Shift-DR states of the TAP state diagram of FIG. 4.

FIG. 2 illustrates a second example of a standard JTAG Test Access Port (TAP) 102 in a device 202. The JTAG TAP of FIG. 2 is exactly the same as the JTAG TAP of FIG. 1. The only difference is that the TRST input to the JTAG TAP is provided by a power on reset (POR) circuit within the device 202 instead of by the optional TRST input.

FIG. 3 illustrates the architecture of the standard JTAG TAP 102. The architecture includes a JTAG TAP controller 302, an instruction register 304, a bypass register 306, one or more data registers 308, multiplexers 310 and 312, and a TDO output registration flip flop (FF) 314. The TAP controller 302 controls the capturing, shifting and updating of data to the instruction register, bypass register, and data registers from TDI to TDO. The instruction register 304 stores an instruction that selects data to be shifted through the single bit bypass register or through a selected data register. The data registers 308 provide data input and data output to test and/or other circuits in the device. The multiplexers 310 and 312 pass the output of the selected register (instruction, bypass, or data) to the TDO output via FF 314. The architecture and operation of the standard JTAG TAP 102 is well known in the industry.

FIG. 4 illustrates the state diagram that defines the operation of the JTAG TAP controller 302 of FIG. 3. State diagram transitions occur on the rising edge of TCK in response the logic level on TMS, as shown in FIG. 5. Also as seen in FIG. 5 and during the Shift-DR and Shift-IR states, data is made available on TDI for input to the JTAG TAP from an external source and data is made available on TDO for output from the JTAG TAP to an external source on the rising edge of TCK. The timing and operation of the TAP state diagram is well known in the industry.

BRIEF SUMMARY OF THE DISCLOSURE

This disclosure describes a method and apparatus for allowing any number of access ports in a device to be selected individually or in groups and controlled by the JTAG TAP interface signals to perform a desired operation. The selection of an individual access port or a group of access ports is achieved using an Access Port Selector circuit that is accessed by the JTAG TAP interface signals.

BRIEF DESCRIPTION OF THE VIEWS OF THE DRAWINGS

FIG. 23A illustrates an operational state diagram for accessing data and instruction registers according to the disclosure.

FIG. 23B illustrates an operational state diagram for accessing data and instruction registers according to the disclosure.

FIG. 23C illustrates an operational state diagram for accessing data and instruction registers according to the disclosure.

FIG. 24 illustrates an alternate non-JTAG access port according to the disclosure.

DETAILED DESCRIPTION OF THE DISCLOSURE

Figure 6:
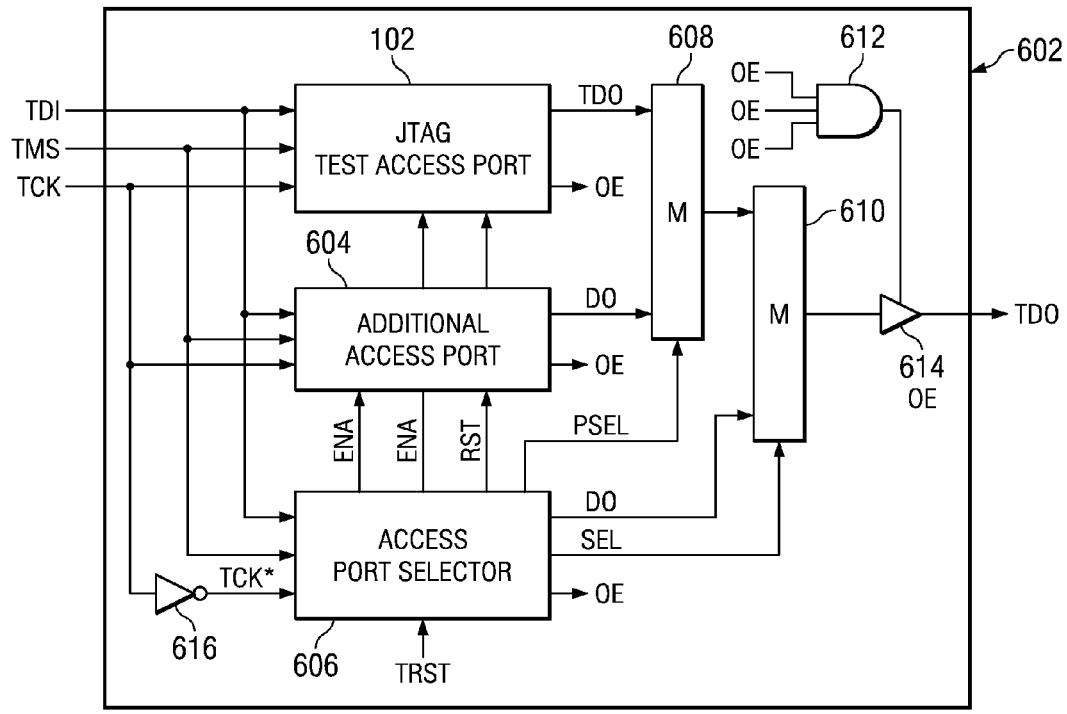
FIG. 6 illustrates an access port selection architecture in a device according to the disclosure.

FIG. 6 illustrates a device 602 containing a first example implementation of the access port selection architecture of the present disclosure. The architecture includes the device's JTAG TAP 102, at least one additional access port 604, an access port selector 606, multiplexers 608 and 610, output enable (OE) gating circuit 612, TDO output buffer 614, and TCK inverter 616. According to the disclosure, the JTAG TAP 102 and the additional access port 604, when enabled, respond to the TMS signal on the rising edge of TCK and the access port selector 606 responds to the TMS signal on the falling edge of TCK. The JTAG TAP 102 includes inputs for TDI, TMS, TCK, reset (RST) and enable (ENA) signals and outputs for OE and TDO signals. The JTAG TAP 102 is augmented with additional circuitry that is responsive to the ENA signal to allow the JTAG TAP 102 to be disabled by the ENA signal and enabled by the ENA signal. An example of this additional enable/disable circuitry is described later in regard to FIG. 13. The additional access port 604 includes inputs for TDI, TMS, TCK, RST and ENA signals and outputs for OE and data output (DO) signals. The access port selector 606 includes inputs for TDI, TMS, inverted TCK (TCK*), and TRST signals and outputs for first and second ENA signals, a RST signal, an OE signal, a Select (SEL) signal, a DO signal, and a port select (PSEL) signal. Multiplexer 608 inputs the TDO output from the JTAG TAP 102, the DO output from the additional access port 604, the PSEL signal from the access port selector 606, and outputs a data output. Multiplexer 610 inputs the data output from multiplexer 608, the DO from the access port selector 606, the SEL output from the access port selector and outputs a data output to TDO output buffer 614. Gating circuit 612, which could be an OR gate, inputs the OE signals from the JTAG TAP, the additional access port, and access port selector and outputs an OE signal to TDO output buffer 614 to enable the buffer to output data during shift operations of the JTAG TAP, additional access port, or access port selector.

Figure 7:
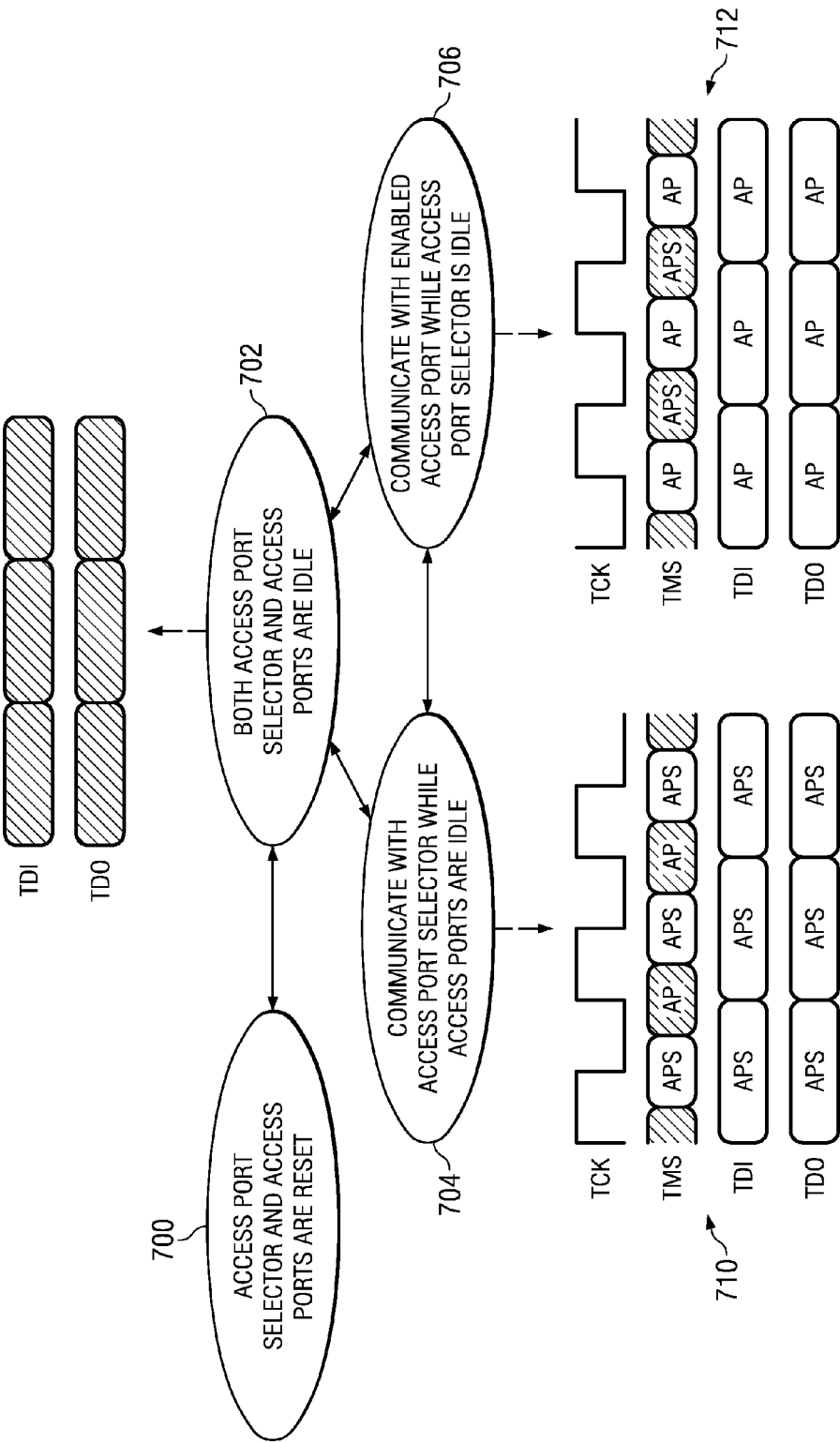
FIG. 7 illustrates the operational state diagram and timing for the access port selection architecture according to the disclosure.

FIG. 7 is provided to illustrate the operational states and timing of the architecture of FIG. 6. The operational states of the architecture consist of; (1) a state 700 where both the access port selector (APS) and access ports (AP) are in a reset state in response to the TRST input or logic values input on TMS, (2) a state 702 where both the access port selector and the access ports are in an idle state in response to logic values input on TMS, (3) a state 704 where communication occurs to the access port selector while the access ports are idle in response to logic values input on TMS, and (4) a state 706 where communication occurs to the enabled access port while the access port selector and other access ports are idle in response to logic values input on TMS. Timing diagram 708 illustrates that logic values input on TMS, indicated by darkened time slots, during the rising and falling edges of TCK in state 702 maintain the access port selector and the access ports in idle state 702. In the idle state, the access port selector and access ports are idle and no data input or data output occurs on TDI and TDO respectively, also indicated by darkened fill. Timing diagram 710 illustrates that values input on TMS (not darkened) during the falling edge of TCK enables the access port selector to input data from TDI and output data on TDO, while idle values on TMS (darkened) are input during the rising edge of TCK to maintain the access ports in an idle state. Timing diagram 712 illustrates that values input on TMS (not darkened) during the rising edge of TCK enables the enabled access port to input data from TDI and output data on TDO, while idle values on TMS (darkened) are input during the falling edges of TCK to maintain the access port selector in an idle state.

During communication with access port selector 606, its SEL output is set to control multiplexer 610 to pass the DO output from the access port selector to the input of TDO buffer 614. Also the OE from the access port selector will be set to cause the gating circuit 612 to enable the output of TDO output buffer 614. In this condition the access port selector is enabled to input data from TDI and output data to TDO. The data input to the access port selector is used to select one of the access ports (i.e. JTAG TAP or additional access port) for access by setting the access port's ENA input to the enable state and outputting control on PSEL to cause multiplexer 608 to select the data output (TDO/DO) from the enabled access port to be output to TDO via multiplexer 610 and TDO buffer 614. An enabled access port remains enabled until the ENA and PSEL signals from the access port selector are changed by a further communication with the access port selector.

When the enabled access port (JTAG TAP or additional access port) is enabled for communication, as mentioned above, it will respond to TMS and TCK to input data from TDI and output data on TDO. During communication the OE signal from the enabled access port will pass through gating circuit 612 to enable the output of TDO output buffer 614.

Figure 8:
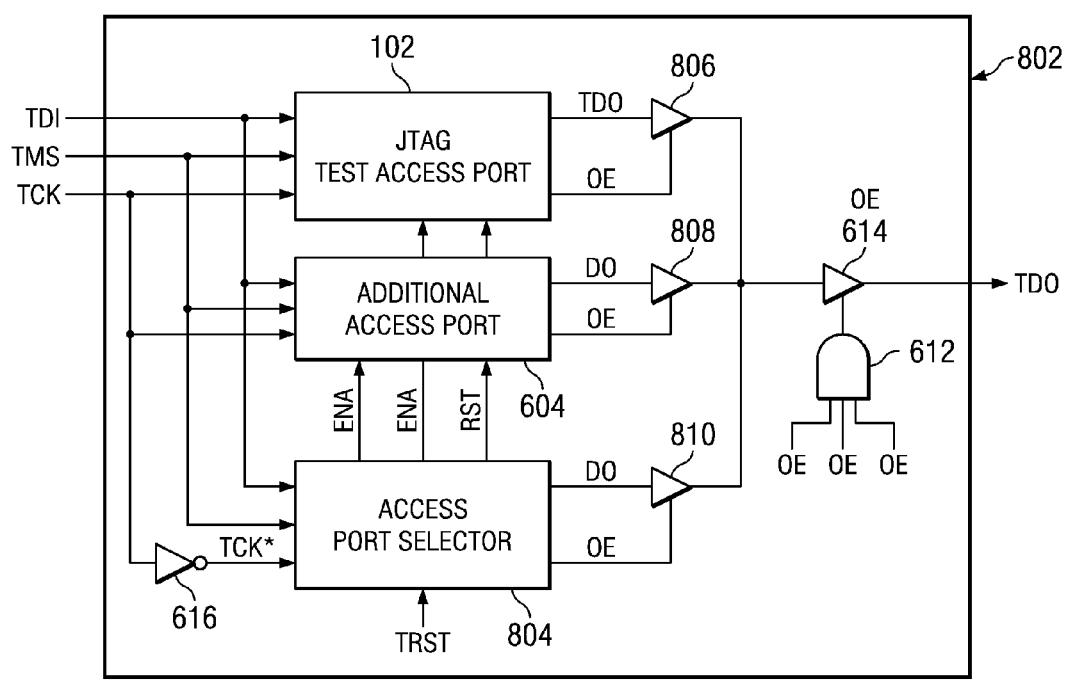
FIG. 8 illustrates an alternate access port selection architecture in a device according to the disclosure.

FIG. 8 is provided to illustrate a second example implementation of the access port selection architecture 802 according to the disclosure. The architecture includes the device's JTAG TAP 102, at least one additional access port 604, an access port selector 804, tri-state buffers 806-810, output enable (OE) gating circuit 612, TDO output buffer 614, and TCK inverter 616. The JTAG TAP 102 and the additional access port 604, when enabled, respond to the TMS signal on the rising edge of TCK and the access port selector 804 responds to the TMS signal on the falling edge of TCK. The JTAG TAP 102 includes inputs for TDI, TMS, TCK, RST and ENA signals and outputs for OE and TDO signals. The JTAG TAP 102 is augmented with additional circuitry that is responsive to the ENA signal to allow the JTAG TAP 102 to be disabled by the ENA signal and enabled by the ENA signal, as mentioned previously in regard to FIG. 6. The additional access port 604 includes inputs for TDI, TMS, TCK, RST and ENA signals and outputs for OE and DO signals. The access port selector 806 includes inputs for TDI, TMS, inverted TCK (TCK*), and TRST signals and outputs for first and second ENA signals, a RST signal, an OE signal, and a DO signal. During falling TCK edge communication with the access port selector 804, the OE signal from the access port selector 804 is set to enable the DO output from the access port selector to be output on TDO via tri-state buffer 810 and TDO output buffer 614. During rising TCK edge communication with the JTAG TAP 102, the OE signal from the JTAG TAP is set to enable the TDO output from the JTAG TAP to be output on TDO via tri-state buffer 806 and TDO output buffer 614. During rising TCK edge communication with the additional access port 604, the OE signal from the additional access port is set to enable the DO output from the additional access port to be output on TDO via tri-state buffer 808 and TDO output buffer 614. As described in regard to FIG. 6, the OE signals from the access port selector, JTAG TAP, and additional access port are input to the enable input of the TDO output buffer 614 via gating circuit 612 (which could be an OR gate). As can be seen, the architecture of FIG. 8 utilizes the OE signals from the access port selector, the JTAG TAP, and the additional access port to couple the data output (TDO/DO) from the port being accessed to the TDO output lead via the tri-state buffers 806-810 and TDO output buffer 614. Thus the PSEL and SEL signals of the architecture of FIG. 6 to control multiplexing of the port data output signals to TDO is not required in the architecture of FIG. 8.

As can be seen from FIGS. 6-8, the process of communicating with a plurality of access ports in a device, according to the disclosure, includes the steps of: (1) communicating with the access port selector 606/804 using the JTAG interface signals to enable a first access port for communication, (2) ceasing communication with the access port selector, (3)

communicating with the first access port using the JTAG interface signals, (4) ceasing communication with the first access port, (5) communicating with the access port selector using the JTAG interface signals to enable a second access port for communication, (6) communicating with the second access port using the JTAG interface signals, and (7) repeating the above steps to access the first and second or any additional desired access ports.

Figure 1:
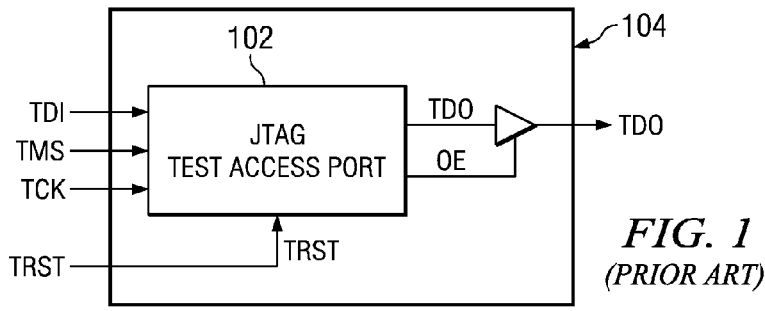
FIG. 1 illustrates a first prior art JTAG test access port in a device.
Figure 2:
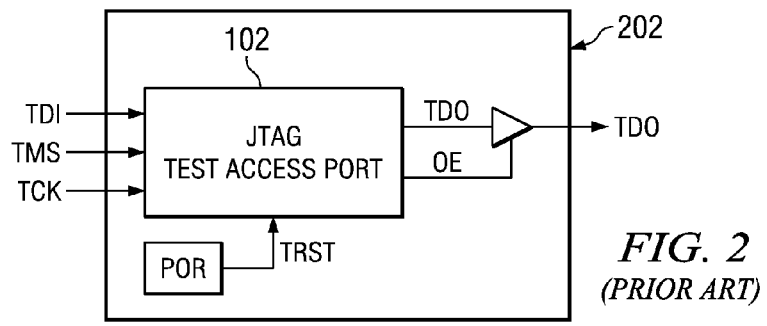
FIG. 2 illustrates a second prior art JTAG test access port in a device.
Figure 3:
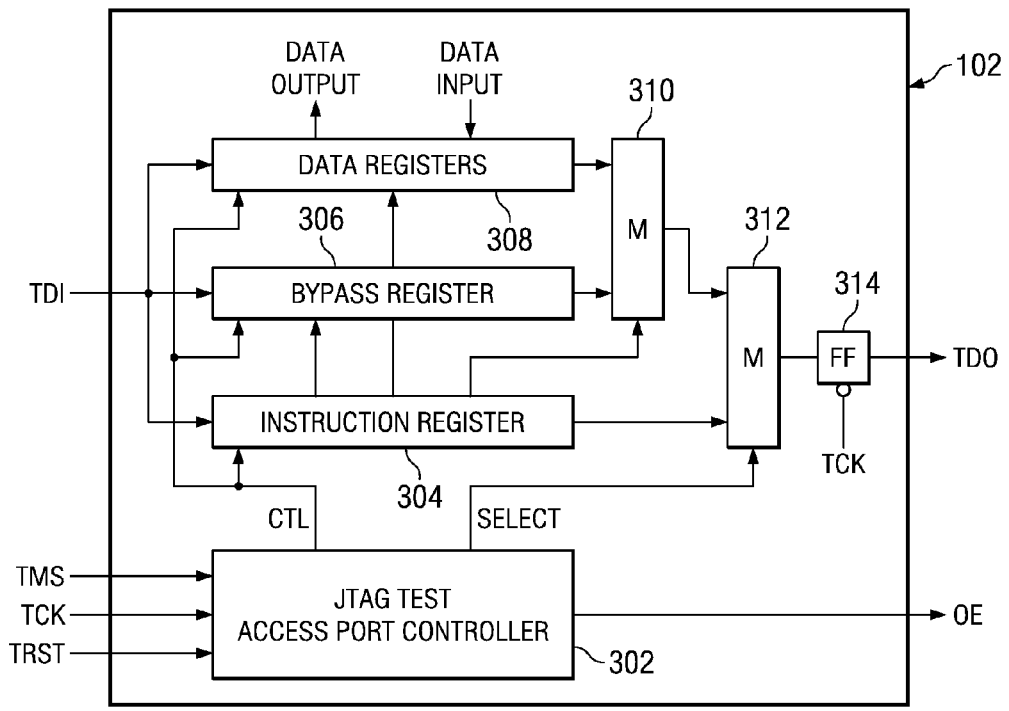
FIG. 3 illustrates the JTAG test access port in more detail.
Figure 9:
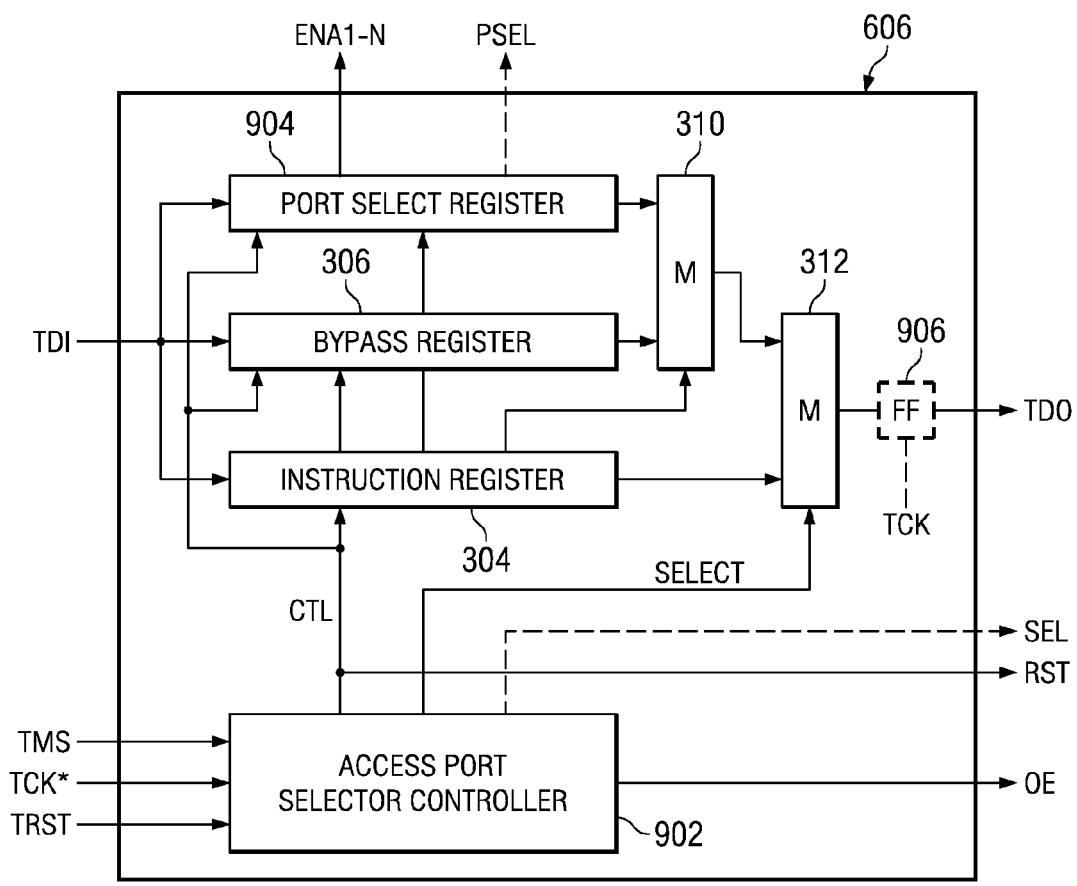
FIG. 9 illustrates the access port selector in more detail according to the disclosure.

FIG. 9 illustrates an example implementation of the access port selector 606 of the access port selection architecture of FIG. 6. The access port selector includes an access port selector controller 902, instruction register 304, single bit bypass register 306, port select register 904, multiplexers 310 and 312, and optionally a TDO registration flip flop (FF) 906. As can be seen, the architecture of the access port selector is identical to the architecture of the JTAG TAP described in regard to FIG. 3 with the exception of the optional TDO registration FF 906 and the fact that it responds to the TMS signal on the falling edge of TCK (TCK*). If the optional FF 906 is used it will register DO data on the rising edge of the TCK signal as shown in timing diagram 710 of FIG. 7. In this example, the access port selector controller 902 operates in response to TMS on the falling edge of TCK (TCK*) according to the TAP state diagram of FIG. 4. In response to TMS and on the falling edge of TCK the access port selector controller 902; (1) captures, shifts and updates instructions into instruction register 304, (2) captures, shifts and updates data into the port select register 904, (3) captures and shifts the bypass register 306, (4) is idle, or (5) is reset.

Figure 4:
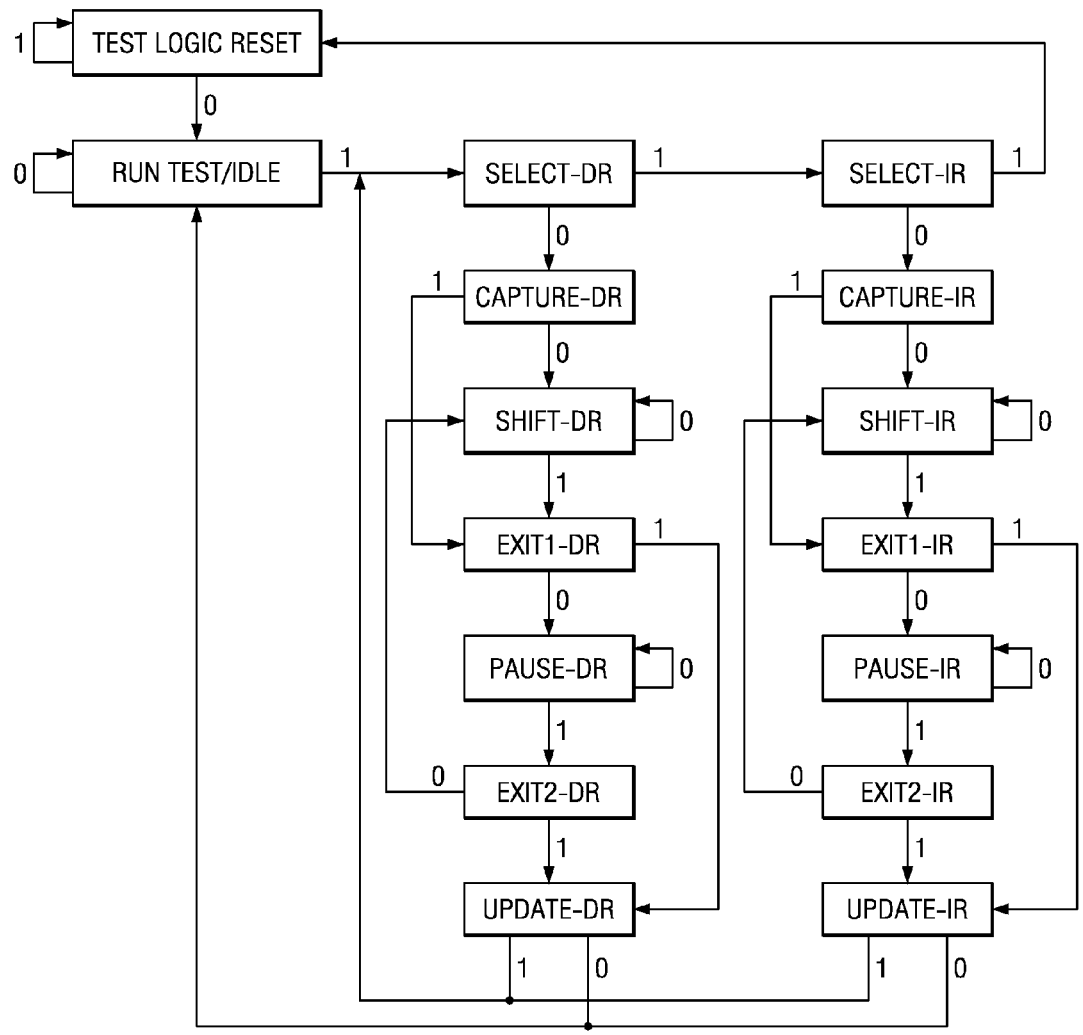
FIG. 4 illustrates the JTAG test access port controller state diagram.
Figure 5:
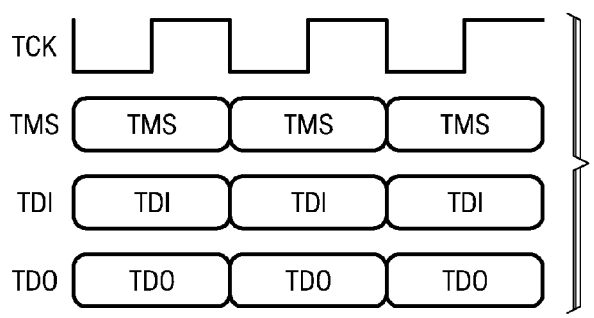
FIG. 5 illustrates interface signal timing for a JTAG test access port in a device.

During instruction capture/shift/update operations the controller 902 outputs control (CTL) to cause the instruction register 304 to capture data during the Capture-IR state of FIG. 4, shift data during the Shift-IR state of FIG. 4, and update data from its outputs during the Update-IR state of FIG. 4. Likewise, during data shift operations the controller 902 outputs control (CTL) to cause the selected data register to capture data during the Capture-DR state of FIG. 4, shift data during the Shift-DR state of FIG. 4, and update data from its outputs (except for the bypass register which has no update output) during the Update-DR state of FIG. 4. During instruction and data shift operations, the controller 902 will set the SEL output to a state that will control multiplexer 610 of FIG. 6 to couple the DO output from the access port selector 606 to the TDO output via TDO output buffer 614. Also during instruction and data shift operations the controller 902 will set the OE output to a state that enables the output of the TDO output buffer 614. During idle operation in the Run Test/Idle state of FIG. 4 no control activity occurs from the controller 902. During reset operation the controller 902 is reset in the Test Logic Reset state of FIG. 4 and outputs a reset signal (RST) signal to the instruction register 304, port select register 904, and to the access ports (JTAG TAP 102 and additional access port 604) coupled to the access port selector 606. The controller 902 can enter reset either by a reset signal applied to the TRST input or by TMS being high for a number of falling edge TCKs, as can be seen in the TAP state diagram of FIG. 4.

The instruction shifted into and updated from the instruction register 304 selects one of the bypass register 306 and port select register 904 for access and couples the data output of the selected register to an input of multiplexer 312 via multiplexer 310 so that it is output on DO to TDO during a data register scan operation.

When the port select register 904 is selected for access between TDI and DO/TDO it receives control (CTL) from the controller 902 to capture data during the Capture-DR state, shift data during the Shift-DR state, and update data to its outputs (ENA signals and PBSEL signals) during the Update-DR state. When the bypass register 306 is selected for access between TDI and DO/TDO it receives control (CTL from the controller 902 to capture data during the Capture-DR state and shift data during the Shift-DR state. The bypass register 306 serves to reduce the shift length through the access port selector 606/804 to only one bit, which is advantageous when multiple device access port selectors are connected in a serial daisy-chain arrangement.

Figure 10:
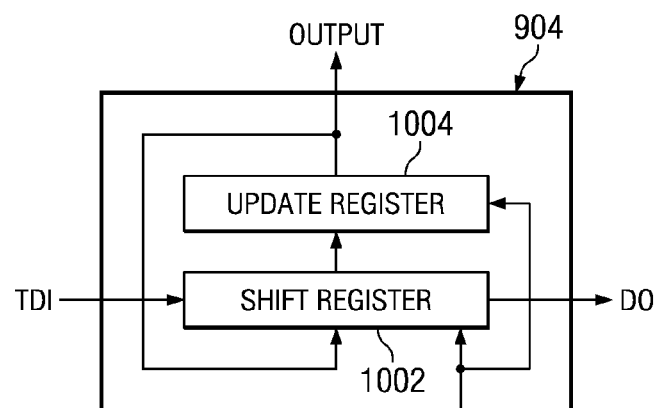
FIG. 10 illustrates the port select register in more detail according to the disclosure.

FIG. 10 illustrates an example implementation of the port select register 904 which comprises a shift register 1002 and an update register 1004. Control (CTL) input bus from the controller 608 causes the shift register 1002 to capture data from the update register 1004 outputs during the Capture-DR state, shift data from TDI to TDO during the Shift-DR state, and update data from the shift register to the update register outputs (i.e. ENA and PBSEL signals) during the Update-DR state. The update register output signals (ENA and PBSEL) captured into the shift register and shifted out during the shift operation can be used to verify or test that the port select register 904 was outputting the correct ENA and PBSEL signals that were updated during a previous capture, shift and update operation. The control (CTL) input bus also carries the RST signal from the controller 608 which when asserted resets the update register 1004 and optionally the shift register 1002. When the update register 1004 is reset it selects the JTAG TAP 102 as the enabled access port by setting the JTAG TAP's ENA signal to the enable state and setting the PBSEL signals to select the JTAG TAP's TDO output to be selected for output on TDO. Selecting the JTAG TAP as the default access port following reset allows the JTAG TAP to be immediately accessed without having to first communicate with the access port selector 606 to select the JTAG TAP.

While FIG. 9 illustrates an example implementation of the access port selector 606 in the architecture of FIG. 6, it can also represent an example implementation of the access port selector 804 in the architecture of FIG. 8 by simply deleting the PBSEL signal output from the port select register 904 and the SEL signal output from the access port selector controller 902 (as shown in dotted line).

Figure 11:
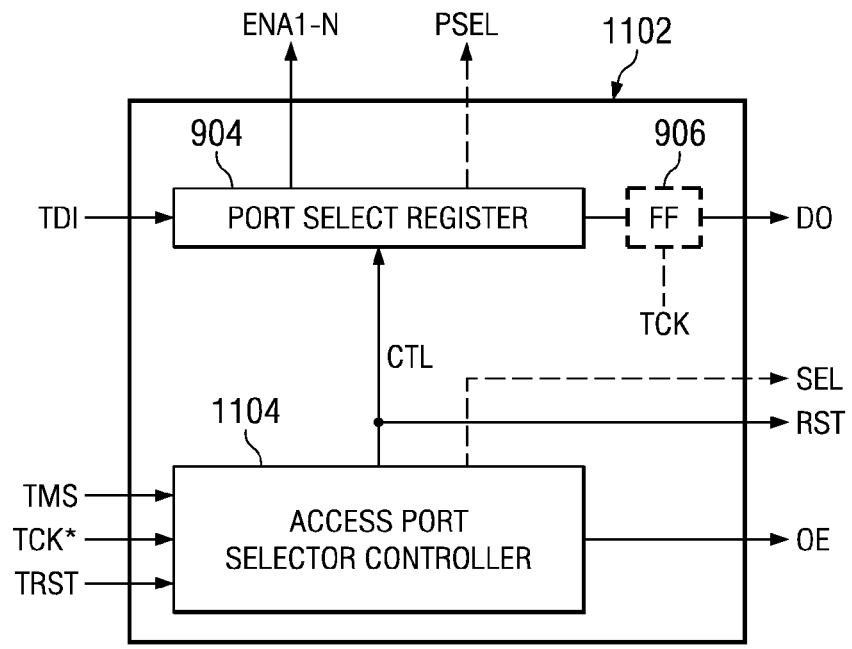
FIG. 11 illustrates an alternate access port selector according to the disclosure.

FIG. 11 illustrates an alternate example implementation of an access port selector 1102 that can be used in the access port selection architecture of FIGS. 8 and 9. The access port selector 1102 includes an access port selector controller 1104, the port select register 904, and optionally DO registration flip flop (FF) 906. As can be seen, the architecture of the access port selector 1102 does not include the instruction register 304, bypass register 306, and multiplexers 310 and 312 of the access port selector 606 of FIG. 9. The access port selector 1102 responds to TMS on the falling edge of TCK to operate according to the state diagram of FIG. 12 to access the port select register (PSR) 904. If the optional FF 906 is used it will register DO data on the rising edge of the TCK signal as describe in FIG. 9.

Figure 12:
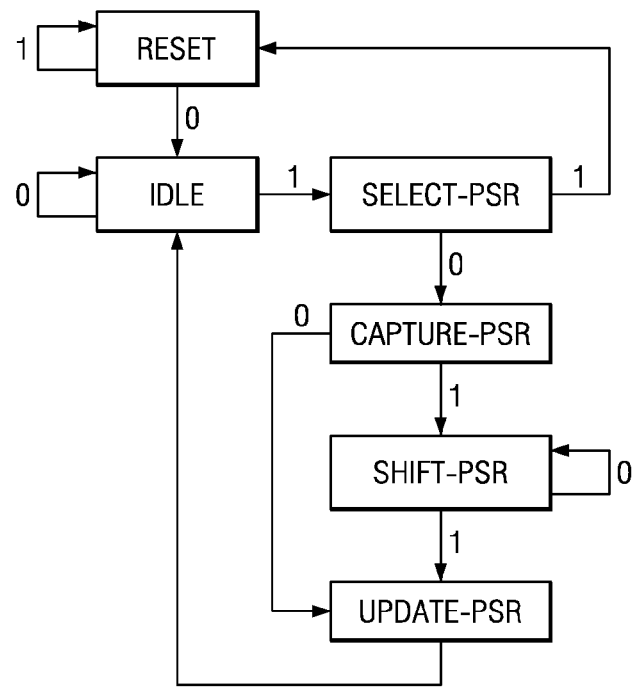
FIG. 12 illustrates an operational state diagram for the alternate access port selector according to the disclosure.

As seen in the state diagram of FIG. 12, the access port selector controller 1104 can be in a Reset state, an Idle state, a Select-PSR state, a Capture-PSR state, a Shift-PSR state, and in an Update-PSR state. In the Reset state, the controller 1104 outputs a reset signal on the RST output which resets the port select register 904, as describe in regard to FIG. 10, and also resets the access ports in the architecture of FIG. 6. In the Idle state, the controller 1104 removes the reset signal from the RST output but does not output any control (CTL) to the port select register 904. In the Select-PSR state, the controller can transition to the Capture-PSR state or the Reset state. In the Capture-PSR state, the controller 1104 outputs control (CTL) to cause the shift register 1002 of the port select register to capture the output (ENA and PBSEL signals) of the update register 1004 as described in FIG. 10. From the Capture-PSR state, the controller 1104 can transition to the Shift-PSR state or to the Update-PSR state. In the Shift-PSR state, the controller 1104 sets the SEL signal to a state that enables the DO output from the port select register to be selected for output on TDO as shown in FIG. 6, sets the OE output to a state that enables the TDO output buffer 614 of FIG. 6, and outputs control (CTL) to cause the shift register 1002 of the port select register to shift data from TDI to DO/TDO. The SEL and OE signals are only set as described above while the controller 1104 is in the Shift-PSR state. In the Update-PSR state, the controller 1104 outputs control (CTL) to update the data in shift register 1002 to the update register 1004.

The state transitions in FIG. 12 occur in response to TMS logic values and in response to the falling edge of TCK. As seen the state diagram will transition to the Reset state from any other state if a number of logic 1's are input on TMS. The Reset state can also be entered in response to a reset signal on the TRST input.

While FIG. 11 illustrates an alternate example implementation of an access port selector 1102 that can be used in the access port selection architecture of FIG. 6, it can also represent an example implementation of an alternate the access port selector that can be used in the architecture FIG. 8 by simply deleting the PBSEL signal output from the port select register 904 and the SEL signal output from the access port selector controller 1104 (as shown in dotted line).

Figure 13:
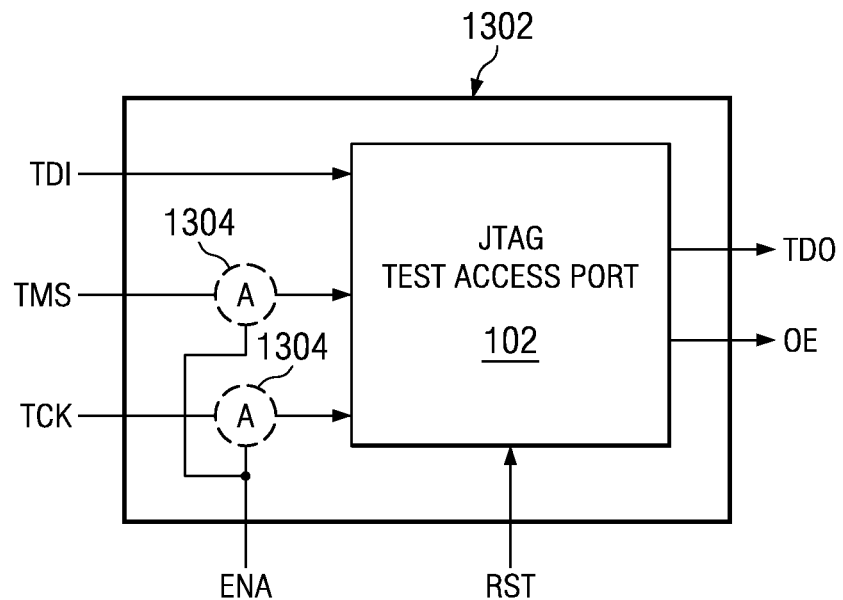
FIG. 13 illustrates circuitry for enabling and disabling a JTAG test access port according to the disclosure.

FIG. 13 illustrates an example of how to use the ENA signal from access port selector 606 of FIG. 6 or from access port selector 804 of FIG. 8 to enable and disable the operation of a JTAG TAP 102 within a device 1302. As seen the ENA signal is input to a gate 1304, an AND (A) gate in this example, that is placed in series with the TCK signal to the JTAG TAP or is placed in series with the TMS signal to the JTAG TAP. As indicated by dotted line, an AND gate 1304 can be used on either the TMS or the TCK signal. Alternately AND gates 1304 may be used on both the TMS and TCK signals. When the ENA signal is set low, the JTAG TAP is disabled since the TMS and/or TCK outputs from the AND gate(s) are forced low. When the ENA signal is set high, the JTAG TAP is enabled since the TMS and/or TCK outputs from the AND gate(s) are enabled to pass the TMS and/or TCK signals to the JTAG TAP. The JTAG TAP can be disabled in and enabled from any of the non-shifting stable states of FIG. 4, i.e. the Test Logic Reset stable state, the Run Test/Idle stable state, the Pause-DR stable state, and the Pause-IR stable state.

Figure 14:
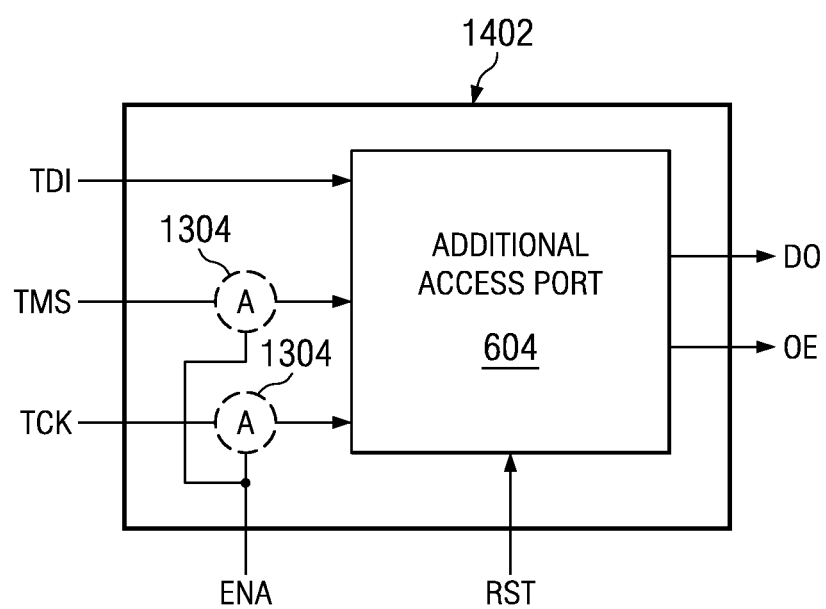
FIG. 14 illustrates circuitry for enabling and disabling an additional access port according to the disclosure.

FIG. 14 illustrates an example of how to use the ENA signal from access port selector 606 of FIG. 6 or from access port selector 804 of FIG. 8 to enable and disable the operation of an additional access port 604 within a device 1402. As seen the ENA signal is input to a gate 1304, an AND (A) gate in this example, that is placed in series with the TCK signal to the additional access port 604 or is placed in series with the TMS signal to the additional access port. As indicated by dotted line, an AND gate 1304 can be used on either the TMS or the TCK signal. Alternately AND gates 1304 may be used on both the TMS and TCK signals. When the ENA signal is set low, the additional access port is disabled since the TMS and/or TCK outputs from the AND gate(s) are forced low. When the ENA signal is set high, the additional access port is enabled since the TMS and/or TCK outputs from the AND gate(s) are enabled to pass the TMS and/or TCK signals to the additional access port. The additional access port can be disabled in and enabled from any of its non-shifting stable states. For example if the additional access port operates according to the state diagram of FIG. 4 it can be disabled in or enabled from the Test Logic Reset stable state, the Run Test/Idle stable state, the Pause-DR stable state, and the Pause-IR stable state.

Figure 15:
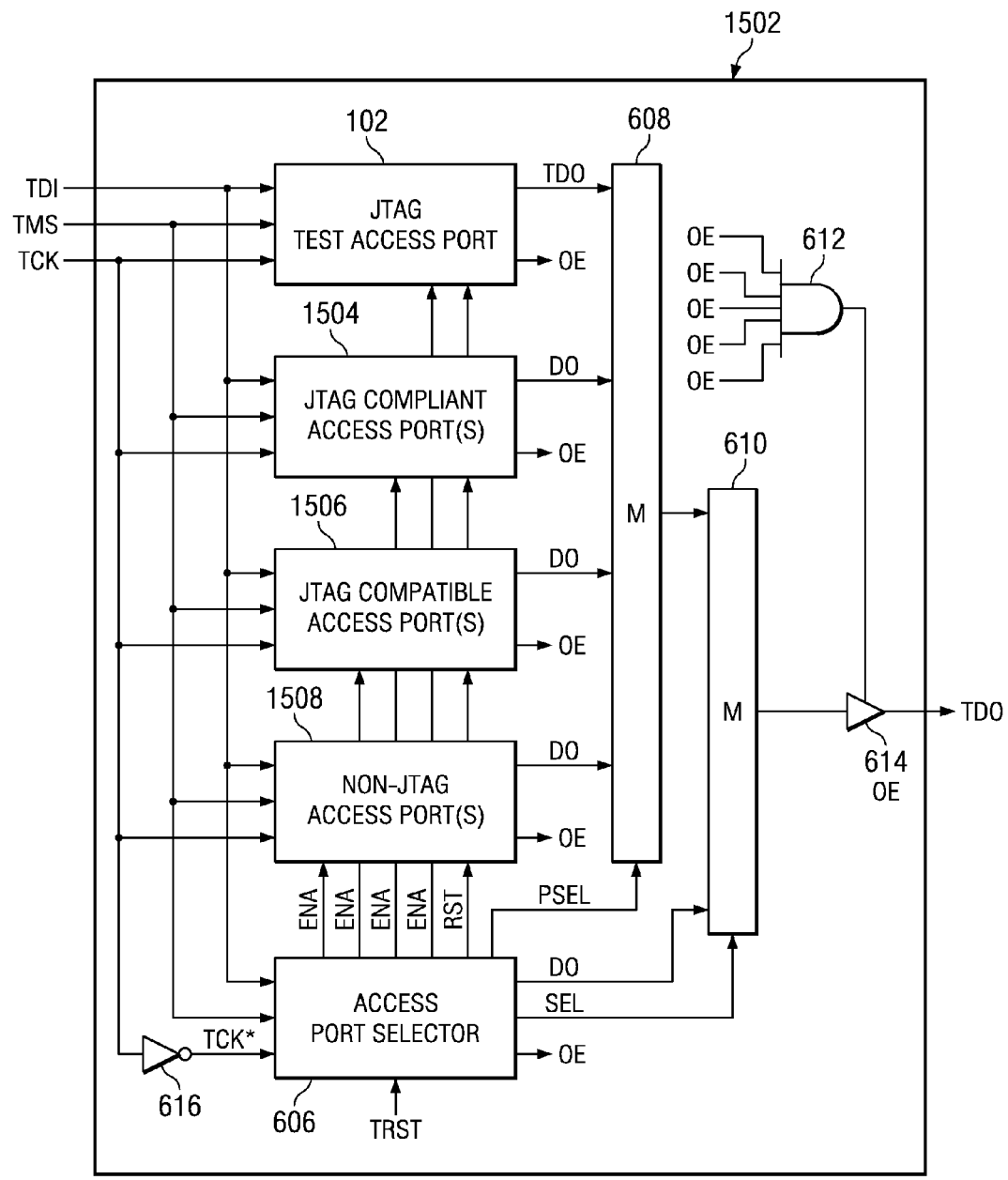
FIG. 15 illustrates an access port selection architecture in a device containing multiple types of access ports according to the disclosure.

FIG. 15 illustrates a device 1502 containing the access port selection architecture previously described in regard to FIG. 6. The architecture includes a JTAG TAP 102, a multiplicity of different types of additional access ports 604 (referenced as access ports 1504, 1506 and 1508), access port selector 606, and TDO multiplexers 608 and 610. The JTAG TAP and the additional access ports all include the TMS and/or TCK enable/disable circuitry described in regard to FIGS. 13 and 14. The additional access ports may include one or more JTAG compliant access ports 1504, one of more JTAG compatible access ports 1506, and one or more non-JTAG access ports 1508. The additional access ports may be used for any type of access operation including but not limited to; test access operations, debug access operations, trace access operations, emulation access operations, programming access operations, embedded instrumentation access operations, or functional circuit access operations.

JTAG compliant access ports 1504, according to this disclosure, are access ports that are fully compliant with the architecture and required instructions of the JTAG TAP 102, but may contain additional instructions and/or circuits to provide extended functionality. JTAG compatible access ports 1506, according to this disclosure, are access ports that are not fully compliant with the architecture and operation of the JTAG TAP 102 but will operate compatibly in at least the Test logic Reset state, the Shift-DR, the Shift-IR state, and the Update-IR state of the TAP state diagram of FIG. 4. Being able to operate compatibly in the Test Logic Reset state, the Shift-DR state, the Shift-IR state, and the Update-IR state enables JTAG compatible access ports to operate with the JTAG TAP and JTAG compliant access ports during reset, data shift, instruction shift, and instruction update operations when the ports are connected together in serial daisy-chain arrangements. Non-JTAG access ports 1508, according to this disclosure, are access ports that have architectures and operation modes that not compliant or compatible with the JTAG TAP 102 or the JTAG compliant/compatible access ports 1504-1506.

When enabled by the access port selector 606, an access port 102, 1504, 1506, and 1508 will respond to TMS on the rising edge of TCK to transition through states and shift data from the device's TDI input to the TDO output.

The access ports 1504-1508 may represent; (1) new IEEE standard access ports that can be enabled by the access port selector 606 and operated using the existing dedicated JTAG TDI, TCK, TMS, and TDO interface signals, (2) new non-IEEE standard access ports (i.e. access ports that are developed by a consortium of companies) that can be enabled by the access port selector 606 and operated using the existing dedicated JTAG TDI, TCK, TMS, and TDO interface signals, or (3) new proprietary access ports a company develops for private use that can be enabled by the access port selector 606 and operated using the existing dedicated JTAG TDI, TCK, TMS, and TDO interface signals. The access ports 1504-1508 may be associated with embedded core circuits in a device such as DSP and CPU core circuits, or the access ports may be associated with the overall circuitry of a device.

Figure 16:
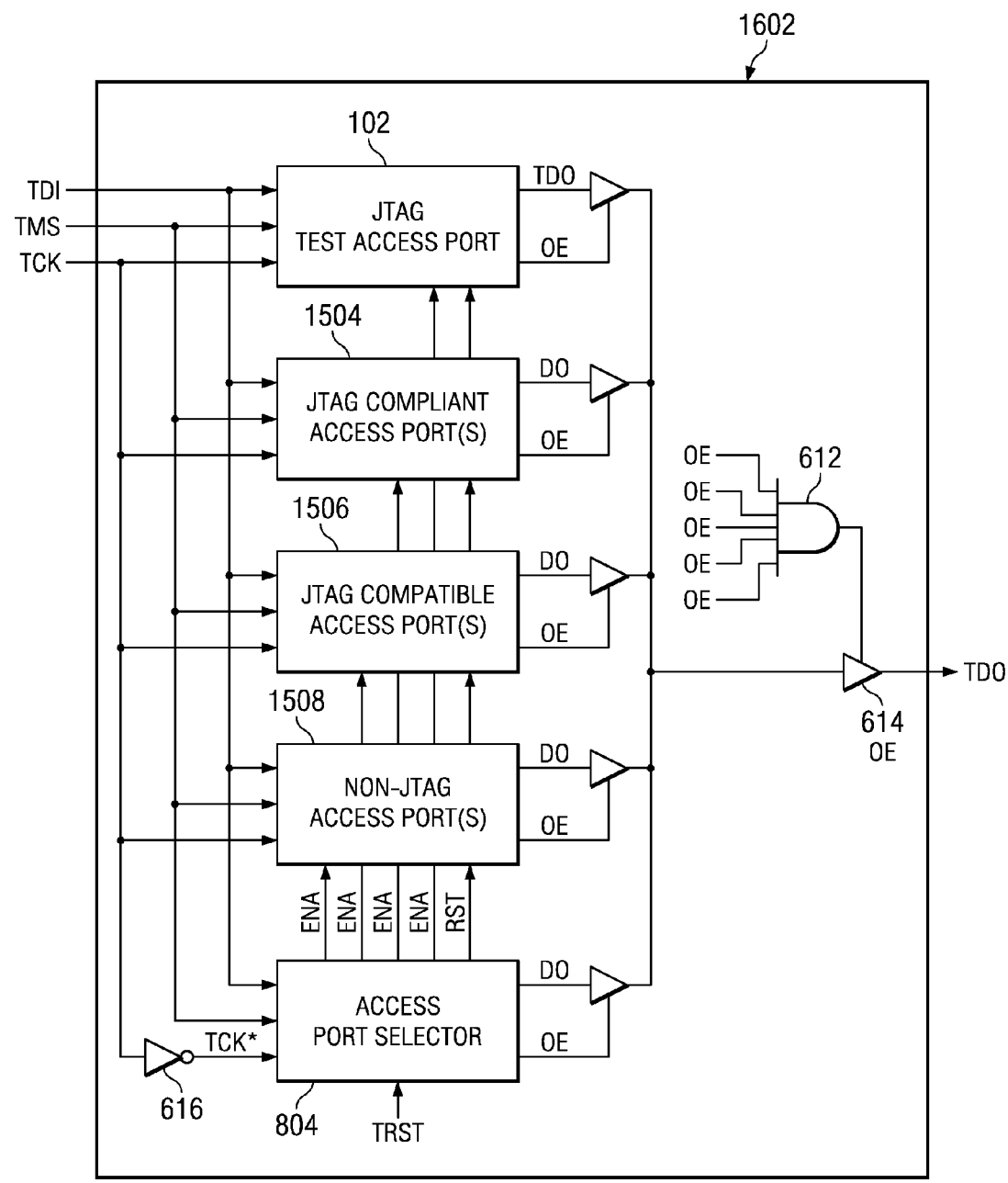
FIG. 16 illustrates an alternate access port selection architecture in a device containing multiple types of access ports according to the disclosure.

FIG. 16 illustrates a device 1602 containing the access port selection architecture previously described in regard to FIG. 8. The architecture includes a JTAG TAP 102, a multiplicity of different types of additional access ports 604 (1504, 1506, and 1508), and access port selector 804. The JTAG TAP 102 and the additional access ports 1504-1508 are the same as described in FIG. 15. The only difference between the architecture of FIG. 16 and the architecture of FIG. 15 is the access port selector 804 and the circuitry (tri-state buffers) used to couple the data output from an enabled access port or the data output from the access port selector to the TDO output of the device.

Figure 17:
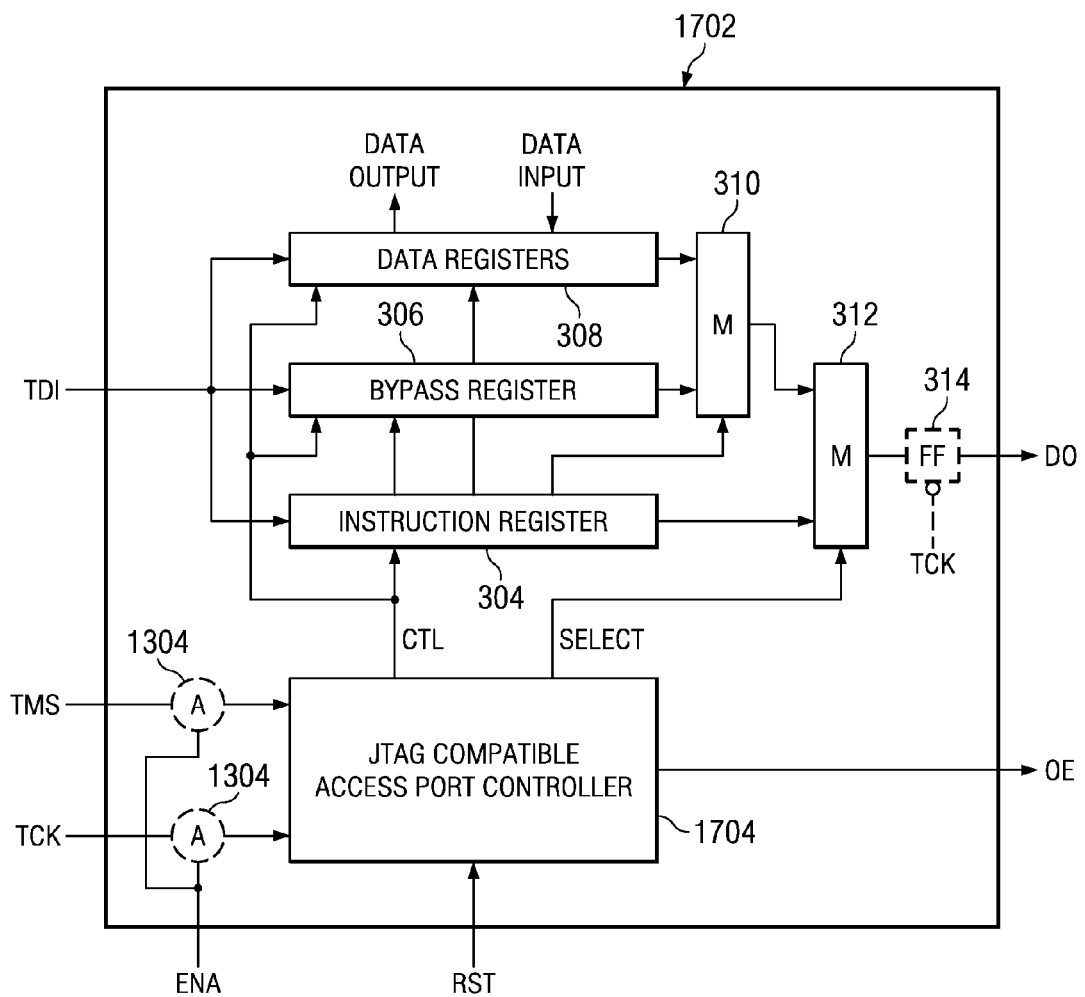
FIG. 17 illustrates a JTAG compatible access port according to the disclosure.
Figure 18:
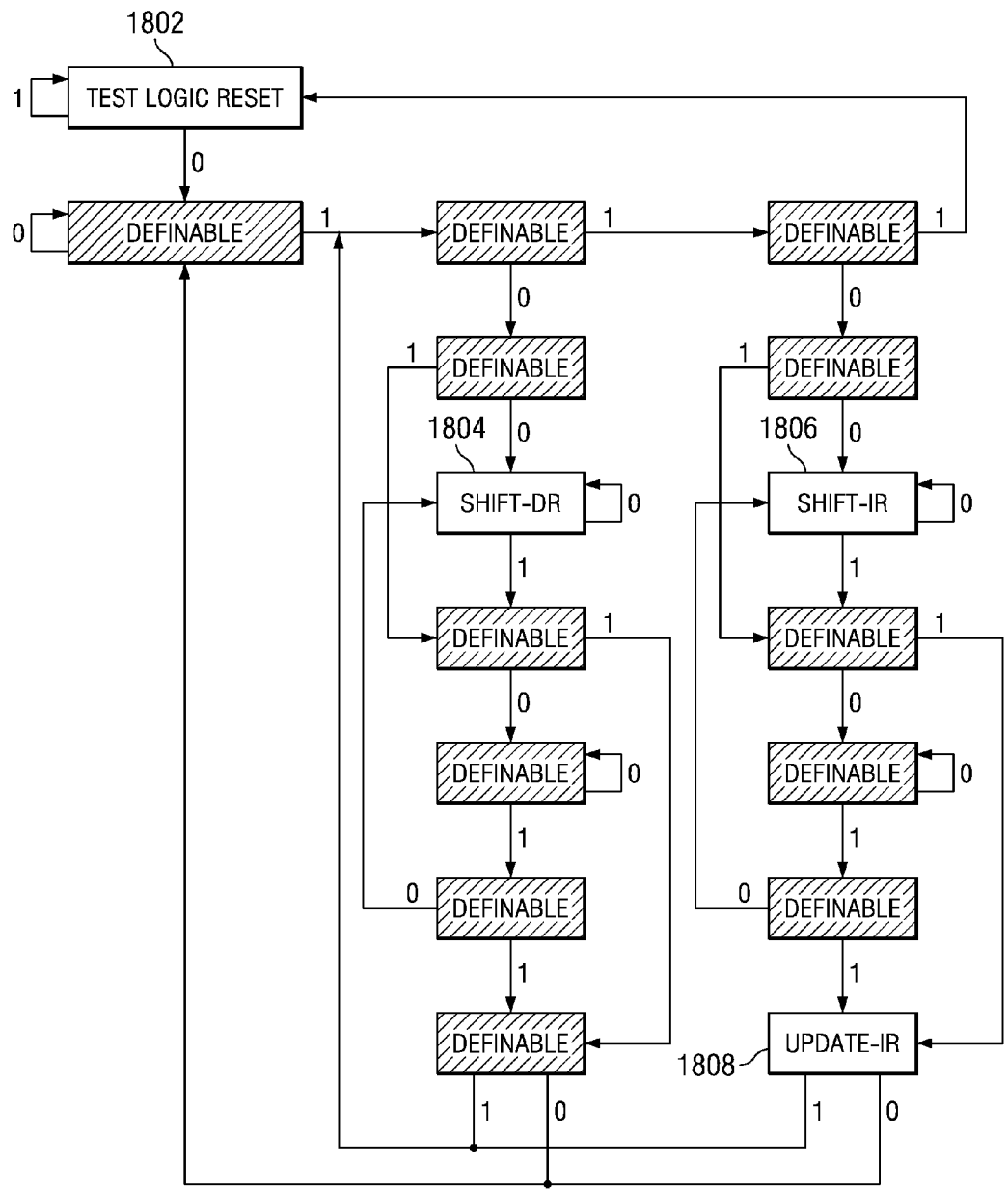
FIG. 18 illustrates an operational state diagram for a JTAG compatible access port according to the disclosure.

FIG. 17 illustrates a first example implementation 1702 of a JTAG compatible access port 1506. The access port 1702 includes a JTAG compatible access port controller 1704, an instruction register 304, bypass register 306, one or more data registers 308, data output (DO) multiplexers 310 and 312, an optional falling TCK edge operated DO registration FF 314, and the TMS and/or TCK enable gates 1304 of FIGS. 13 and 14. When enabled by the ENA input from the access port selector 606/804 and the RST input is not asserted, the controller 1704 responds to TMS on the rising edge of TCK to transition through and operate in the states of FIG. 18. As seen in FIG. 18, the only defined states of the JTAG compatible controller 1704 state diagram are the Test Logic Reset state 1802, the Shift-DR state 1804, the Shift-IR state 1806, and the Update-IR state 1808. As mentioned in regard to FIG. 15, the Test Logic Reset state 1802 is compatible with the Test Logic Reset state of FIG. 4 to allow compatible resetting, the Shift-DR state 1804 is compatible with the Shift-DR state of FIG. 4 to allow compatible data shifting, the Shift-IR state 1806 is compatible with the Shift-IR state of FIG. 4 to allow compatible instruction shifting, and the Update-IR state is compatible with the Update-IR state of FIG. 4 to allow compatible instruction updating. The other states in the controller 1704 state diagram of FIG. 18 are definable to allow customizing the state operation of a JTAG compatible access port for a desired purpose. The state operation purpose may be similar to the state operation purpose of the JTAG TAP state diagram of FIG. 4 or different from the state operation purpose of the JTAG TAP state diagram of FIG. 4.

Figure 19:
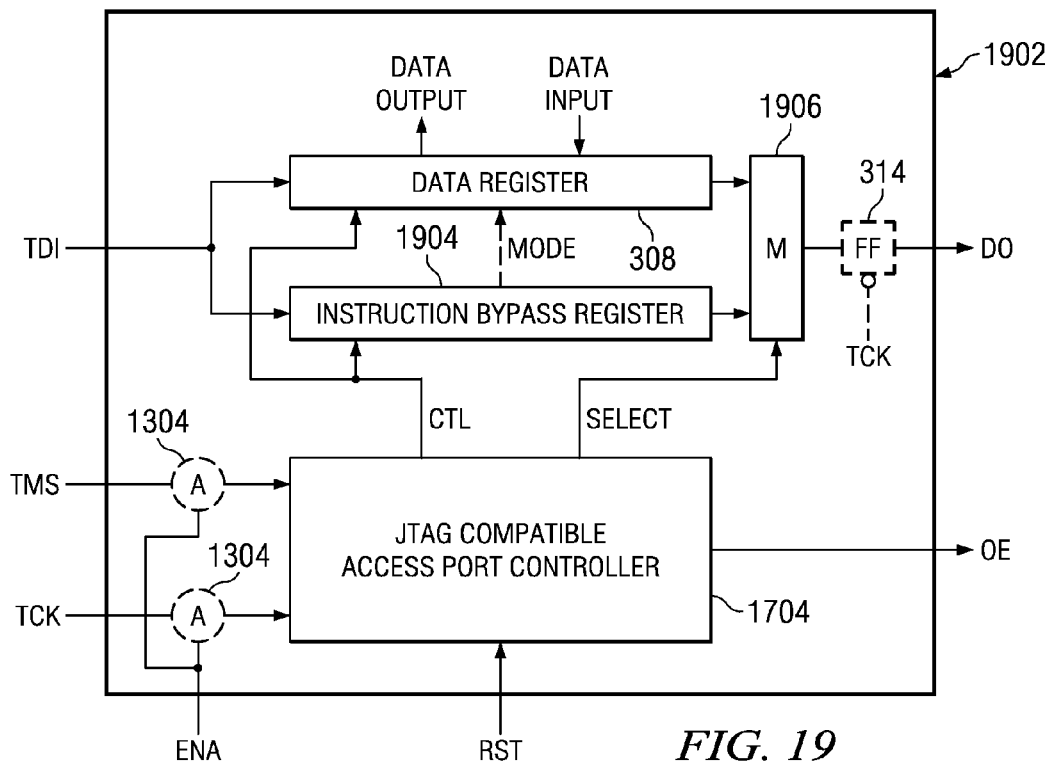
FIG. 19 illustrates an alternate JTAG compatible access port according to the disclosure.

FIG. 19 illustrates a second example implementation 1902 of a JTAG compatible access port 1506. The access port 1902 includes a JTAG compatible access port controller 1704, an instruction bypass register 1904, a data register 308, data output (DO) multiplexer 1906, an optional falling TCK edge operated DO registration FF 314, and the TMS and/or TCK enable gates 1304 of FIGS. 13 and 14. When enabled by the ENA input from the access port selector 606/804 and the RST input is not asserted, the controller 1704 responds to TMS on the rising edge of TCK to transition through and operate in the states of FIG. 18 as described in regard to FIG. 17. The instruction bypass register 1904 is a two bit register that couples TDI to TDO during Shift-IR operations to maintain instruction shifting compatibility with series connected JTAG TAPs and/or JTAG compliant access ports. At the beginning of a Shift-IR operation, the two FFs of the instruction bypass register 1904 will output a leading "01" pattern to DO/TDO as required by JTAG IEEE 1149.1 instruction registers. The type of JTAG compatible access port in FIG. 19 may be used when the purpose of the access port is only to serially access the data register 308 to input data to a circuit destination in a device and/or output data from a circuit source in a device. As seen in dotted line, the bits shifted into the two FFs may optionally be used as mode inputs to the data register, to allow the data register to operate in different modes when it is accessed.

Figure 20:
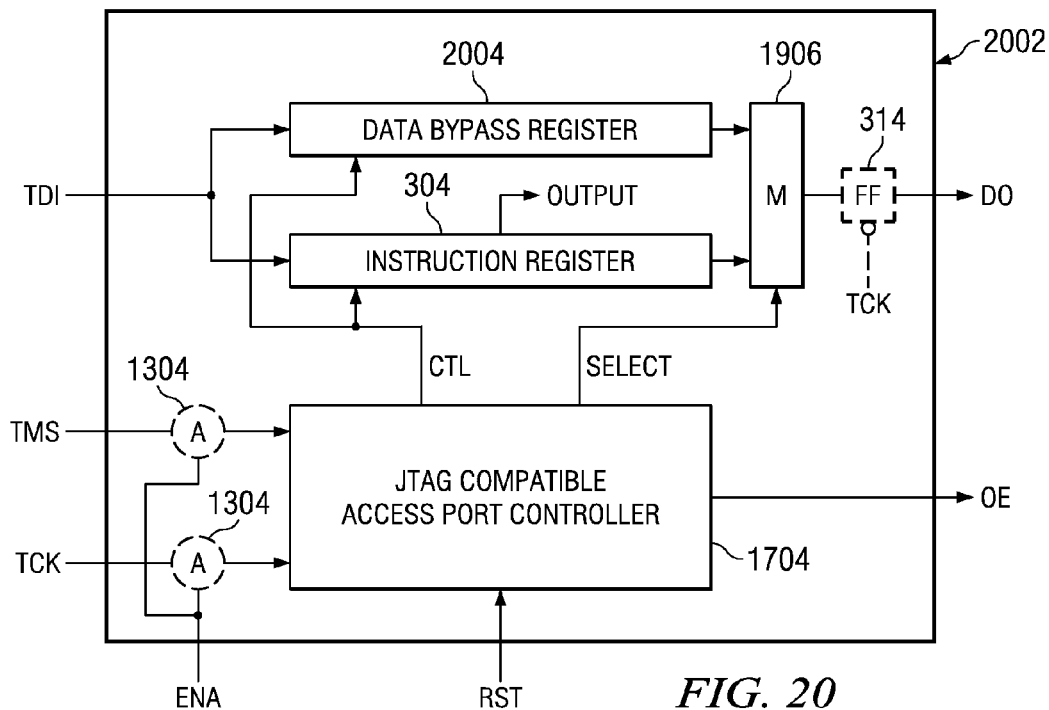
FIG. 20 illustrates another alternate JTAG compatible access port according to the disclosure.
Figure 21:
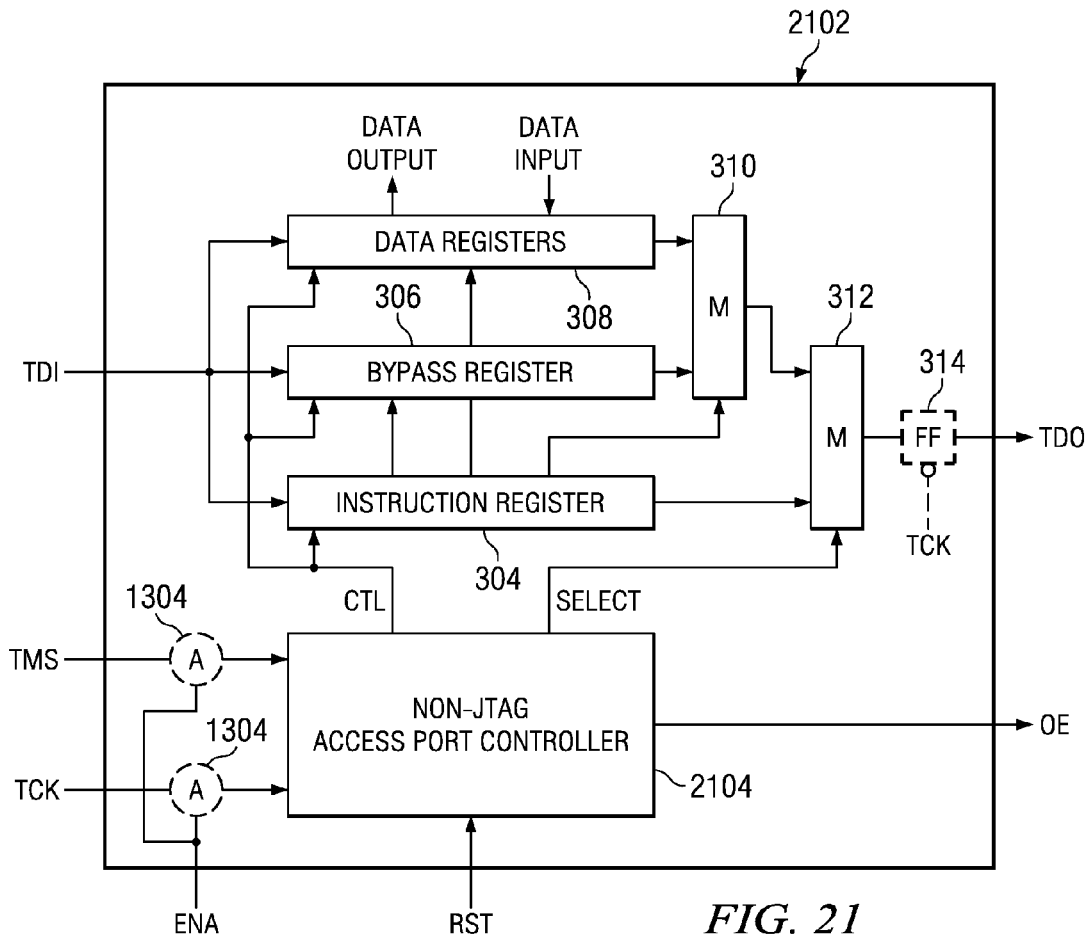
FIG. 21 illustrates a non-JTAG access port according to the disclosure.
Figure 22:
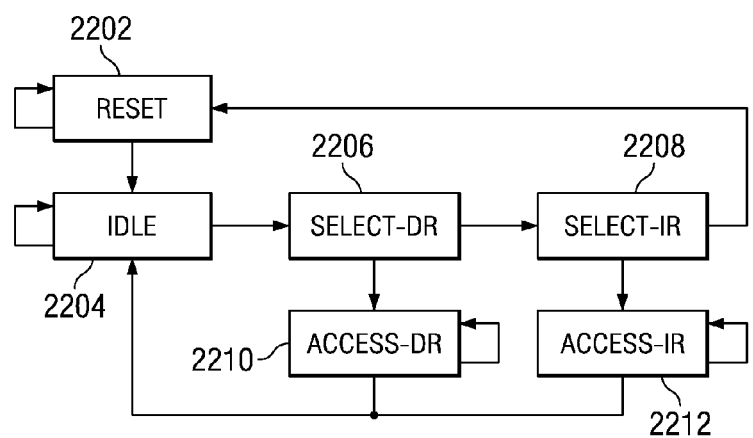
FIG. 22 illustrates an operational state diagram for a non-JTAG access port according to the disclosure.

FIG. 20 illustrates a third example implementation 2002 of a JTAG compatible access port 1506. The access port 2002 includes a JTAG compatible access port controller 1704, an instruction register 304, a data bypass register 2004, data output (DO) multiplexer 1906, an optional falling TCK edge operated DO registration FF 314, and the TMS and/or TCK enable gates 1304 of FIGS. 13 and 14. When enabled by the ENA input from the access port selector 606/804 and the RST input is not asserted, the controller 1704 responds to TMS on the rising edge of TCK to transition through and operate in the states of FIG. 18 as described in regard to FIG. 17. The data bypass register 2004 is a single FF that couples TDI to TDO during Shift-DR operations to maintain data shifting compatibility with series connected JTAG TAPs and/or JTAG compliant access ports. At the beginning of a Shift-DR operation, the FF of the data bypass register 2004 will output a leading "0" to DO/TDO as required by JTAG IEEE 1149.1 bypass registers. The type of JTAG compatible access port in FIG. 20 may be used when the purpose of the access port is only to serially access the instruction register 304 to input instructions to a circuit destination within a device FIG. 21 illustrates a first example implementation 2102 of a non-JTAG access port 1508. The access port 2102 includes a non-JTAG access port controller 2104, an instruction register 304, bypass register 306, one or more data registers 308, data output (DO) multiplexers 310 and 312, an optional falling TCK edge operated DO registration FF 314, and the TMS and/or TCK enable gates 1304 of FIGS. 13 and 14. When enabled by the ENA input from the access port selector 606/804 and the RST input is not asserted, the controller 2104 responds to TMS on the rising edge of TCK to transition through and operate in the states of the state diagram of FIG. 22. The state diagram of FIG. 22 is similar to the state diagram of FIG. 4 in regard to the Reset state 2202, Idle state 2204, Select-DR state 2206, and Select-IR 2208 state. However the data register access state (Access-DR) 2210 and the instruction register access state (Access-IR) 2212 states may be designed completely different from the data register and instruction access states of FIG. 4.

FIG. 23A illustrates a first example state transition diagram for the Access-DR and Access-IR states 2210-2212 of FIG. 22 whereby a capture state is provided for capturing data into the IR or a DR, a shift state is provided for shifting data from TDI to DO/TDO through the IR or a DR, and an update state is provided for updating data from the IR or a DR. FIG. 23B illustrates a second example state transition diagram for the Access-DR and Access-IR states 2210-2212 of FIG. 22 whereby a capture state is provided for capturing data into the IR or a DR, a shift state is provided for shifting data from TDI to DO/TDO through the IR or a DR, and an exit state is provided for repeating the capture and shift operations or exiting the capture and shift operations. FIG. 23C illustrates a third example state transition diagram for the Access-DR and Access-IR states 2210-2212 of FIG. 22 whereby a shift state is provided for shifting data from TDI to DO/TDO through the IR or a DR, an update state is provided for updating data from the IR or DR, and an exit state is provided for repeating the shift and update operations or exiting the shift and update operations.

FIG. 24 illustrates a second example implementation 2402 of a non-JTAG access port 1508. The access port 2402 includes a non-JTAG access port controller 2104, an instruction register 304, a data register 308, data output (DO) multiplexer 2404, an optional falling TCK edge operated DO registration FF 314, and the TMS and/or TCK enable gates 1304 of FIGS. 13 and 14. When enabled by the ENA input from the access port selector 606/804 and the RST input is not asserted, the controller 2104 responds to TMS on the rising edge of TCK to transition through and operate in the states of the state diagram of FIG. 22. During the Access-DR state 2210 the data register 308 is accessed from TDI to DO/TDO and during the Access-IR state 2212 the instruction register is accessed from TDI to DO/TDO. The instruction loaded into the instruction register 304 can be used to output mode control to place the data register 308 in different operational modes and/or to output control to other circuits in a device.

Figure 25:
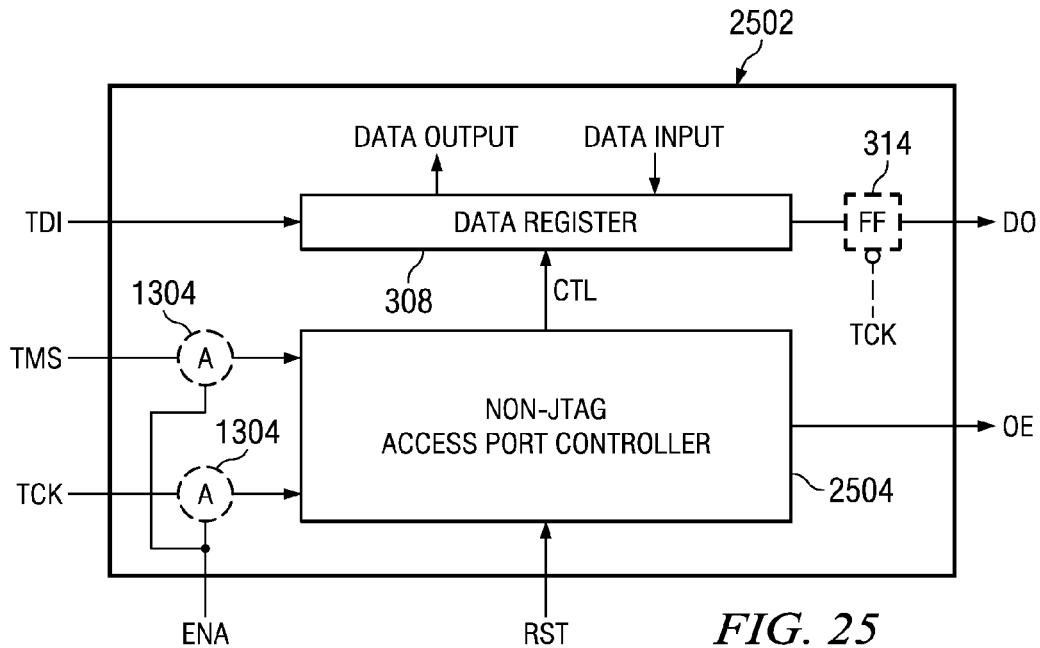
FIG. 25 illustrates an alternate non-JTAG access port according to the disclosure.

FIG. 25 illustrates a third example implementation 2502 of a non-JTAG access port 1508. The access port 2502 includes a non-JTAG access port controller 2504, a data register 308, an optional falling TCK edge operated DO registration FF 314, and the TMS and/or TCK enable gates 1304 of FIGS. 13 and 14. When enabled by the ENA input from the access port selector 606/804 and the RST input is not asserted, the controller 2504 responds to TMS on the rising edge of TCK to transition through and operate in the states of state diagram of FIG. 26 or state diagram of FIG. 27. The difference between the two state diagrams is that the diagram of FIG. 26 includes a reset state whereas the diagram of FIG. 27 does not include the reset state. During the Access-DR states of FIGS. 26 and 27 the data register 308 is accessed from TDI to DO/TDO. The Access-DR states of FIGS. 26 and 27 could be designed as shown in the state diagram examples of FIG. 23A, 23B, or 23C.

Figure 28:
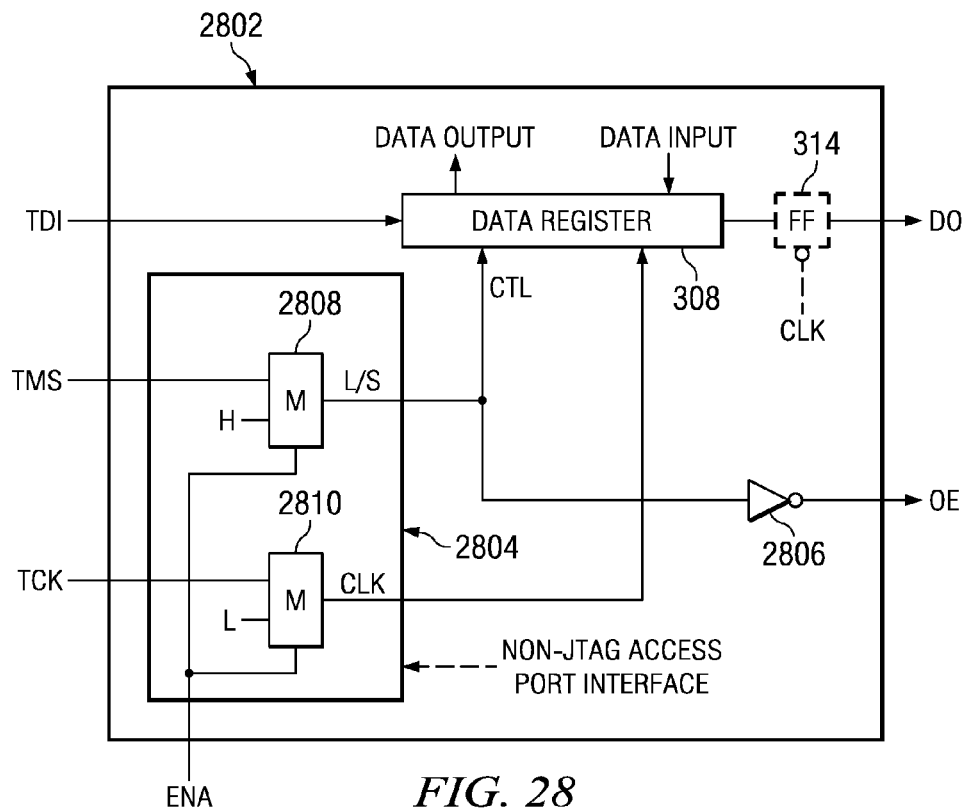
FIG. 28 illustrates an alternate non-JTAG access port according to the disclosure.

FIG. 28 illustrates a fourth example implementation 2802 of a non-JTAG access port 1508. The access port 2802 includes a non-JTAG access port interface 2804 consisting of two multiplexers 2808 and 2810, a data register 308, inverter 2806 and an optional falling TCK edge operated DO registration FF 314. When the ENA signal input from the access port selector 606/804 is set low (i.e. the port disable state), multiplexer 2808 sets the load/shift (L/S) signal output to data register 308 high (H) and multiplexer 2810 sets the clock (CLK) signal output to data register 308 low (L). When the ENA signal input is set high (i.e. port enable state), multiplexer 2808 allows the TMS signal to drive the L/S signal to the data register and multiplexer 2810 allows the TCK signal to drive the CLK signal to the data register. When the L/S signal is driven high by TMS, the data register loads or captures data on the rising edge of the CLK signal and when the L/S signal is driven low by TMS the data register shifts data from TDI to DO/TDO on the rising edge of the CLK input. As seen in this example, the L/S signal is coupled to the port OE signal via inverter 2806 to enable the TDO output buffer 614 of FIGS. 15 and 16 to output data from DO to TDO when the L/S signal is low to shift the data register. When the port is disabled (ENA signal is low) the OE signal will be driven low by the high being output on the L/S signal from multiplexer 2808.

Figure 29:
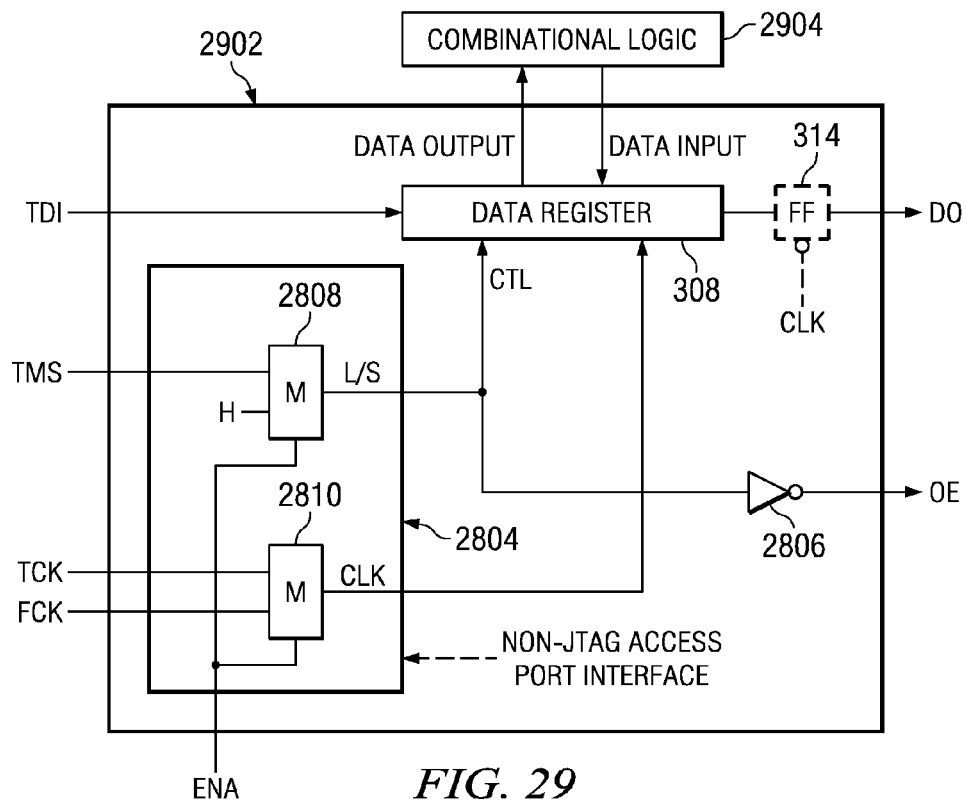
FIG. 29 illustrates an alternate non-JTAG access port according to the disclosure.

FIG. 29 illustrates a fifth example implementation 2902 of a non-JTAG access port 1508. The access port 2902 is similar to access port 2802 in that it includes the non-JTAG access port interface 2804, a data register 308, inverter 2806 and an optional falling TCK edge operated DO registration FF 314. The access port 2902 can operate the data register 308 in either a functional mode or in a test mode in response to the ENA signal. When the ENA signal input from the access port selector 606/804 is set low (i.e. the port disable state), multiplexer 2808 sets the L/S signal output to data register 308 high and multiplexer 2810 selects a functional clock (FCK) signal to drive the CLK signal output to data register 308. While the ENA input is low the data register 308 operates as a device functional register in response to the rising edge of the FCK signal to input and output functional data to and from functional combinational logic 2904. When the ENA signal input is set high (i.e. port enable state), multiplexer 2808 selects the TMS signal to drive the L/S signal and multiplexer 2810 selects the TCK signal to drive the CLK signal. While the ENA input is high the data register 308 operates as a scan test register in response the rising edge of TCK to shift test data in and out of the data register while TMS (L/S) is low and to capture test data from the combinational logic 2904 when TMS (L/S) is high. As mentioned in FIG. 28, the L/S signal enables the TDO output buffer 614 via inverter 2806 during data register shift operations. Also as mentioned in FIG. 28, when the port is disabled (ENA signal is low) the OE signal will be driven low by the high being output on the L/S signal from multiplexer 2808.

Figure 30:
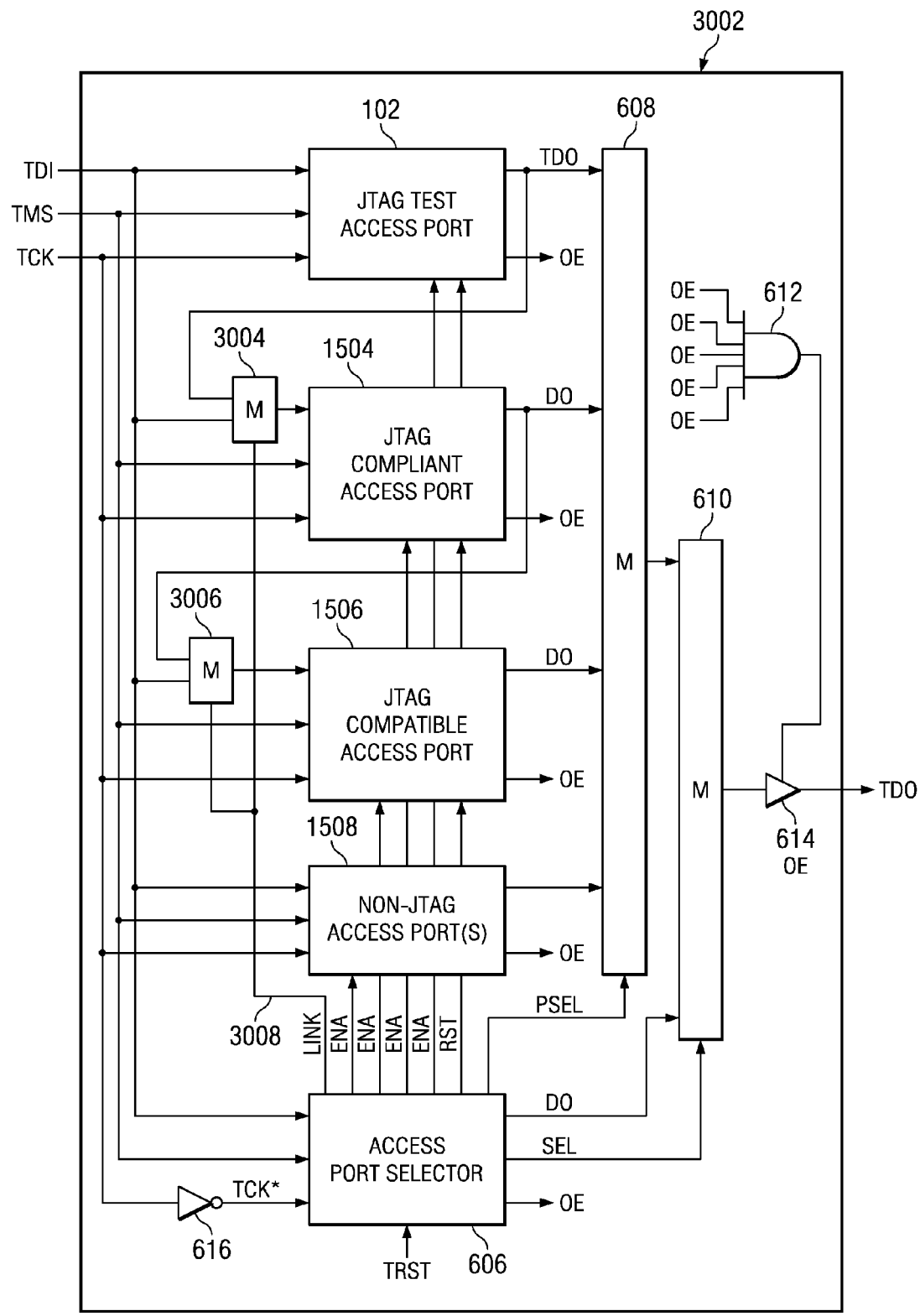
FIG. 30 illustrates an access port selection architecture in a device capable of serially linking multiple access ports according to the disclosure.
Figure 31:
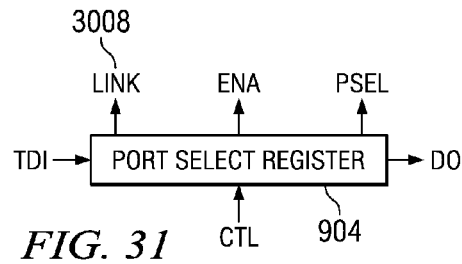
FIG. 31 illustrates a port select register augmented with access port linking control signals according to the disclosure.

FIG. 30 illustrates a device 3002 containing the port access architecture of FIG. 15 modified to allow the JTAG TAP, JTAG compliant access ports, and JTAG compatible access ports to be serially linked together. The architecture is identical to the FIG. 15 architecture with the exception that multiplexers 3004 and 3006 have been placed on the TDI inputs of the JTAG compliant access port 1504 and JTAG compatible access port 1506 and the access port selector 606 has been modified to include link control outputs 3008. The modification of the access port selector 606 can be achieved by simply adding additional serial register bits to the port select register 904 to provide the link control outputs 3008 as shown in FIG. 31. When the link control outputs are not set for linking the access the ports 102, 1504, and 1506, the access ports may be individually accessed as described in regard to FIG. 15. If the link control input to multiplexer 3004 is set for linking, ports 102 and 1504 are serially linked together so that data and instructions can be communicated through the ports from the TDI input of port 102 to the DO output of port 1504 and on to the TDO output of the device via multiplexers 608 and 610. If the link control input to multiplexer 3006 is set for linking, ports 1504 and 1506 are serially linked together so that data and instructions can be communicated through the ports from the TDI input of port 1504 to the DO output of port 1506 and on to the TDO output of the device via multiplexers 608 and 610. When both multiplexers are set for linking, data and instructions can be communicated through ports 102, 1504 and 1506 from the TDI input of port 102 to the DO of port 1506. Port linking is beneficial when multiple ports need to operate together to perform a complex test, debug, emulation, programming, instrumentation, or functional operation in a device. JTAG compatible ports 1506 can be linked with JTAG TAP 102 and JTAG compliant ports 1504 since they operate compliantly in the Shift-IR and Shift-DR states of FIG. 18.

Figure 32:
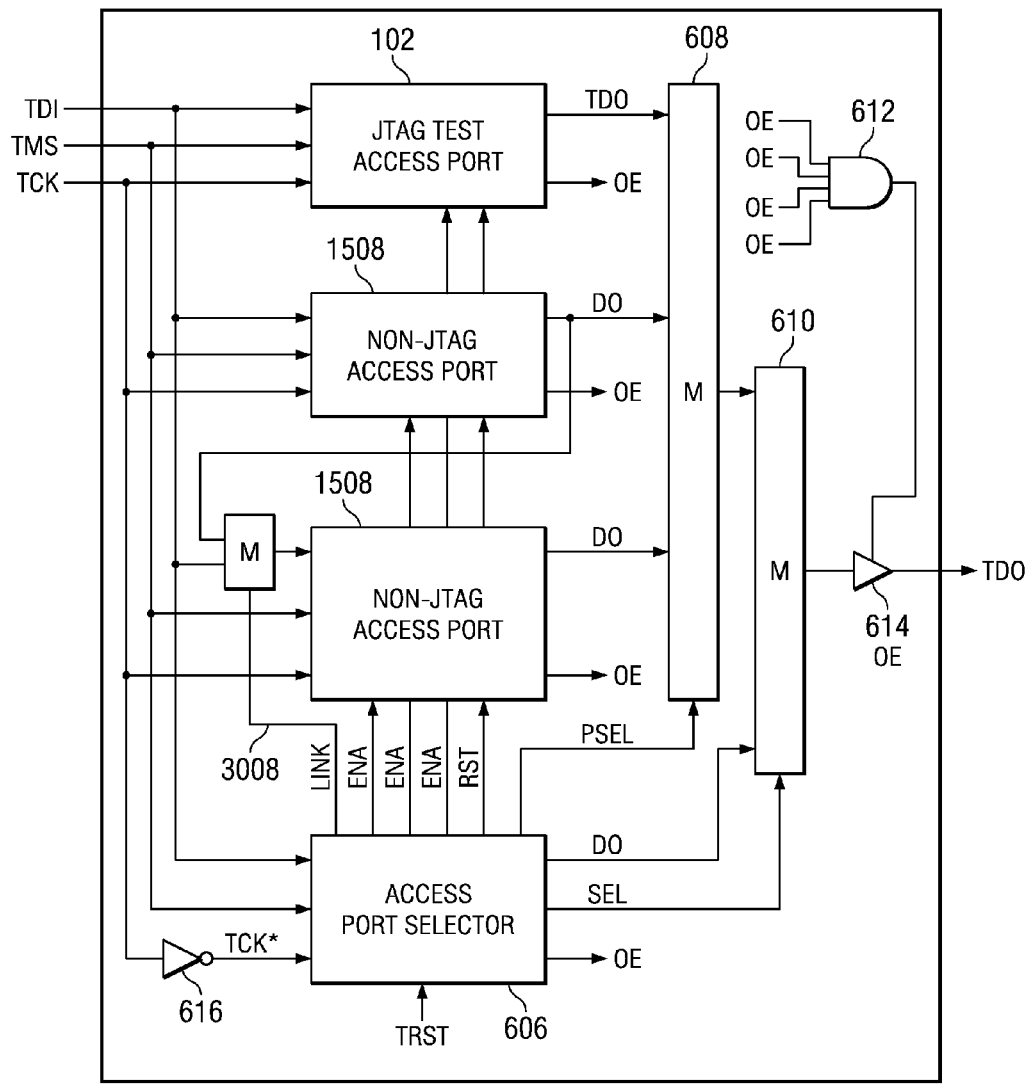
FIG. 32 illustrates another access port selection architecture in a device capable of serially linking multiple access ports according to the disclosure.

FIG. 32 is provided to simply illustrate that non-JTAG access ports 1508 may also be serially linked together and accessed from TDI to TDO as describe in FIG. 30, as long as the ports 1508 use compatible shifting protocols.

The data registers 308 of the access ports 102, 1504, 1506 and 1508 in this disclosure may be used for any type of operation including but not limited to; a test operation, a debug operation, a trace operation, an emulation operation, a programming operation, an instrumentation operation, a functional digital operation, a functional mixed signal operation, and a functional analog operation. Some example data registers 308 of this disclosure are described below in FIGS. 33-40.

Figure 33:
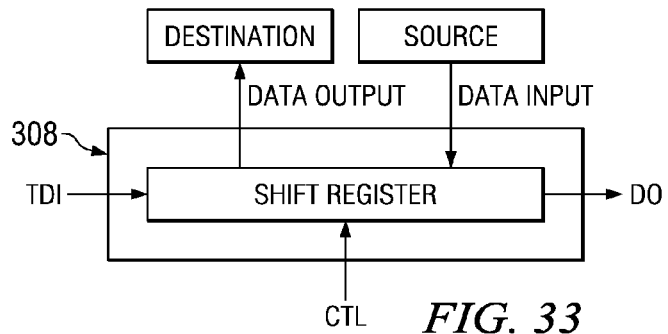
FIG. 33 illustrates a data register of an access port according to the disclosure.

FIG. 33 illustrates an example data register 308 of this disclosure that operates in response to CTL input from an access port of this disclosure to; (1) input data from TDI and output the data to a destination and (2) input data from a source and output the data to TDO via DO.

Figure 34:
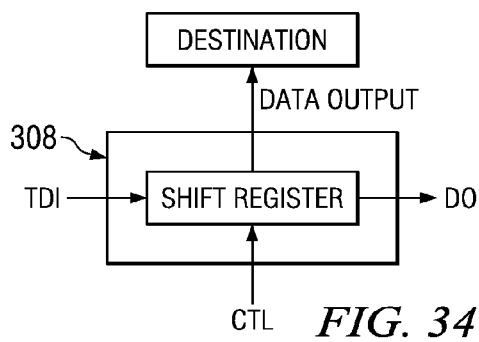
FIG. 34 illustrates a data register of an access port according to the disclosure.

FIG. 34 illustrates an example data register 308 of this disclosure that operates in response to CTL input from an access port of this disclosure to input data from TDI and output the data to a destination.

Figure 35:
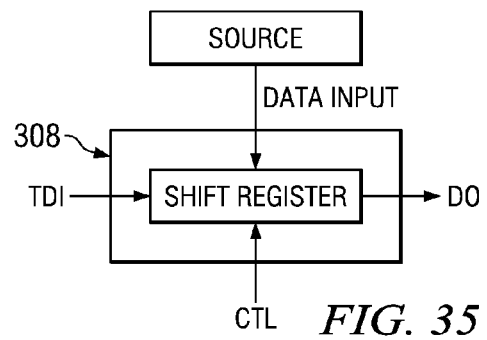
FIG. 35 illustrates a data register of an access port according to the disclosure.

FIG. 35 illustrates an example data register 308 of this disclosure that operates in response to CTL input from an access port of this disclosure to input data from a source and output the data to TDO via DO.

Figure 36:
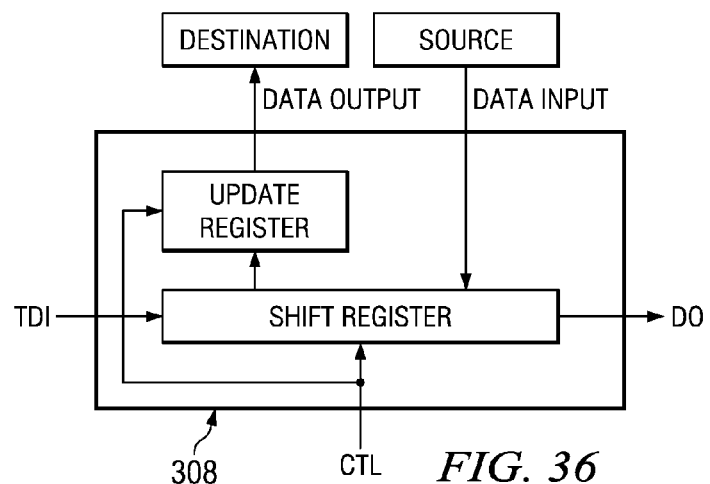
FIG. 36 illustrates a data register of an access port according to the disclosure.

FIG. 36 illustrates an example data register 308 of this disclosure that operates in response to CTL input from an access port of this disclosure to; (1) input data from TDI and output the data to a destination via an update register and (2) input data from a source and output the data to TDO via DO.

Figure 37:
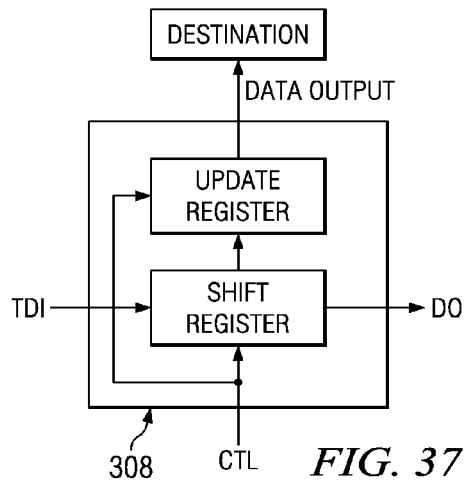
FIG. 37 illustrates a data register of an access port according to the disclosure.

FIG. 37 illustrates an example data register 308 of this disclosure that operates in response to CTL input from an access port of this disclosure to input data from TDI and output the data to a destination via an update register.

The sources and destinations of FIGS. 33-47 may be; (1) test circuits or circuits being tested, (2) debug circuits or circuits being debugged, (3) trace circuits or circuits being traced, (4) emulation circuits or circuits being emulated, (5) programming circuits or circuits being programmed, (6) instrumentation circuits or circuits be instrumented, and/or (7) functional circuits or circuits being functioned. The functional circuits of this disclosure include, but are not limited too, digital circuits such as DSPs and CPUs, mixed signal circuits such as DACs, ADCs, CODECs and PLLs, and analog circuits such as amplifiers, translators and receivers.

Figure 38:
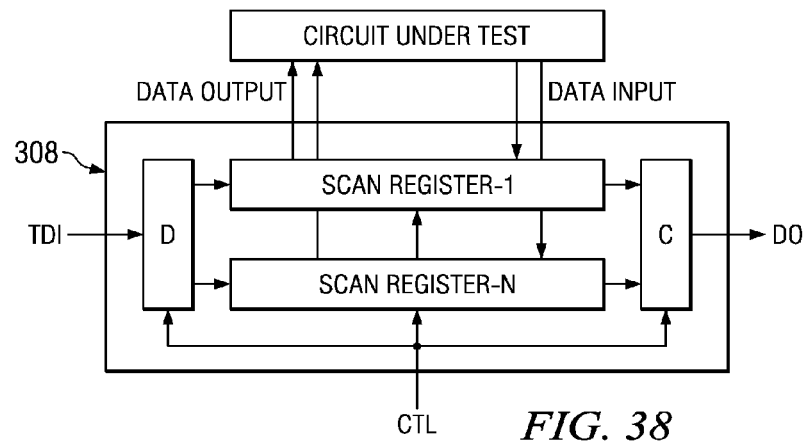
FIG. 38 illustrates a data register of an access port according to the disclosure.

FIG. 38 illustrates an example data register 308 of this disclosure that operates in response to CTL input from an access port of this disclosure as a scan test compression circuit for testing circuits-under-test within a device. Scan test compression circuits, such as Mentor's Test Kompress™ circuit, are well known. Scan test compression circuits use a decompressor (D) to decompress a serial input from a tester (TDI) into parallel outputs that are shifted into parallel scan registers and applied as stimulus to the circuit-under-test. Scan test compression circuits also use a compactor (C) circuit to compact the circuit-under-test response output from the parallel scan registers into a serial output to the tester (DO/TDO).

Figure 39:
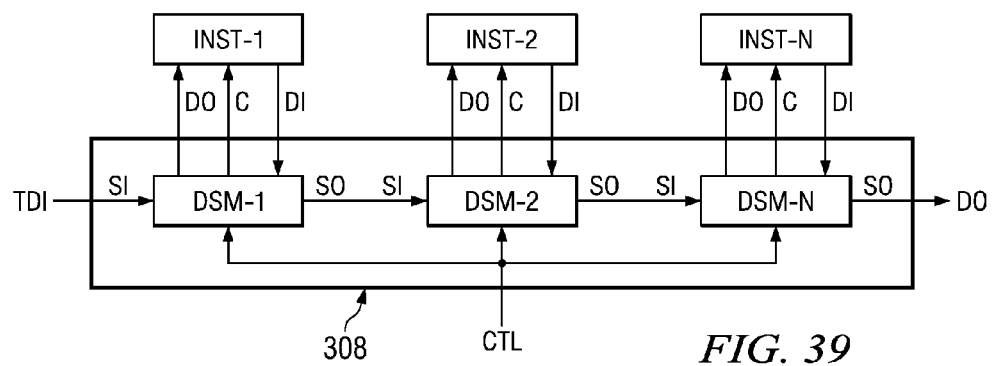
FIG. 39 illustrates a data register of an access port according to the disclosure.
Figure 40:
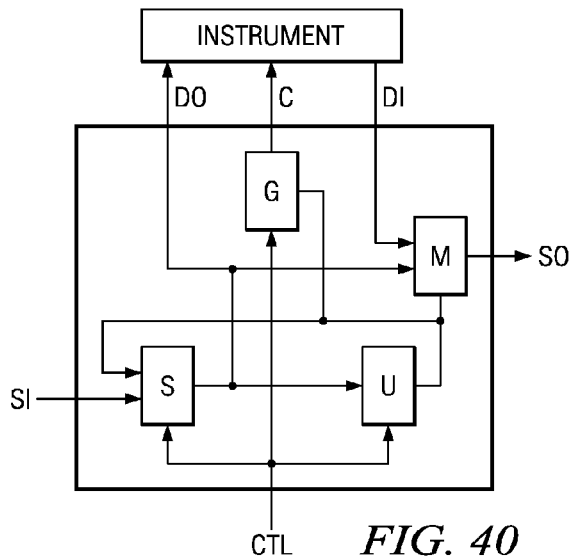
FIG. 40 illustrates a circuit for accessing an instrument connected to the data register of FIG. 39 according to the disclosure.

FIG. 39 illustrates an example data register 308 of this disclosure that operates in response to CTL input from an access port of this disclosure as an instrument access register to access embedded instruments within a device. The instrument access register includes a series of device select modules (DSM) as described in U.S. Pat. No. 4,872,169 and shown in FIG. 40. Each DSM has a shift register (S), update register (U), multiplexer (M), and control gating (G). Serial data (SI) shifted into the shift register (S) is either output on the serial output (SO) via the multiplexer or routed through an instrument via DO and DI then output on the serial output via the multiplexer (M). The routing path is selected by the data bit value updated into the update register (U). To select access to an instrument the data value shifted into the shift register (S) and updated into the update register (U) enables the control gating (G) to pass control (CTL) to the instrument and controls the multiplexer (M) to output data from the instrument. In this arrangement data can communicated to and from the instrument from SI to SO of the DSM. Any number of instruments can be accessed by simply providing a DSM for each instrument. An instrument access register similar to that of FIG. 39 is being proposed for standardization in developing IEEE standard P1687.

Figure 41:
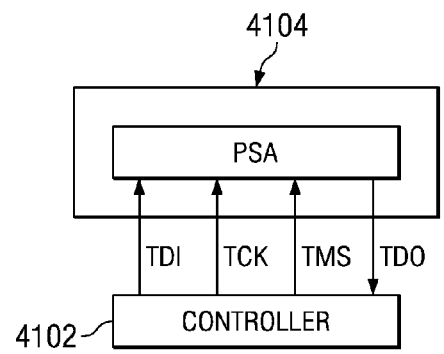
FIG. 41 illustrates a connection between a controller and a single device containing an access port selection architecture according to the disclosure.

FIG. 41 illustrates an example interface between a controller 4102 and a single device 4104 containing one of the port selection architectures (PSA) described in regard to FIGS. 6, 8, 15, 16, 30 and 32 of this disclosure. The controller 4102 communicates with the PSA as described in regard to FIG. 7 to select an access port for access, then access the access port. When the device 4104 powers up or in response to a reset input on TRST or a reset sequence on TMS, the PSA's JTAG TAP will be selected for immediate access as mentioned in regard to FIG. 10. The controller 4102 may be a test controller, a debug controller, an emulation controller, a programming controller, an instrumentation controller, or a functional controller.

Figure 42:
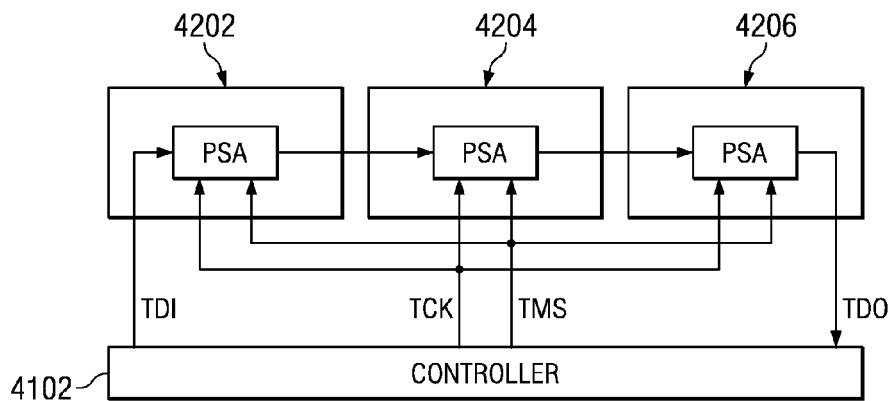
FIG. 42 illustrates a connection between a controller and a multiple daisy-chained devices, each device containing an access port selection architecture according to the disclosure.

FIG. 42 illustrates an example interface between a controller 4102 and a daisy-chain of devices 4202-4206, each device containing one of the port access architectures (PSA) described in regard to FIGS. 6, 8, 15, 16, 30 and 32 of this disclosure. The controller 4102 communicates with each of the daisy-chained PSA as described in regard to FIG. 7 to select an access port in each PSA for access, then accesses the daisy-chained access ports. As mentioned in regard to FIG. 41 the JTAG TAP of each device PSA will be immediately available for access by the controller 4102 after the devices 4202-4206 power up or in response to a TRST signal or TMS reset sequence.

Figure 43:
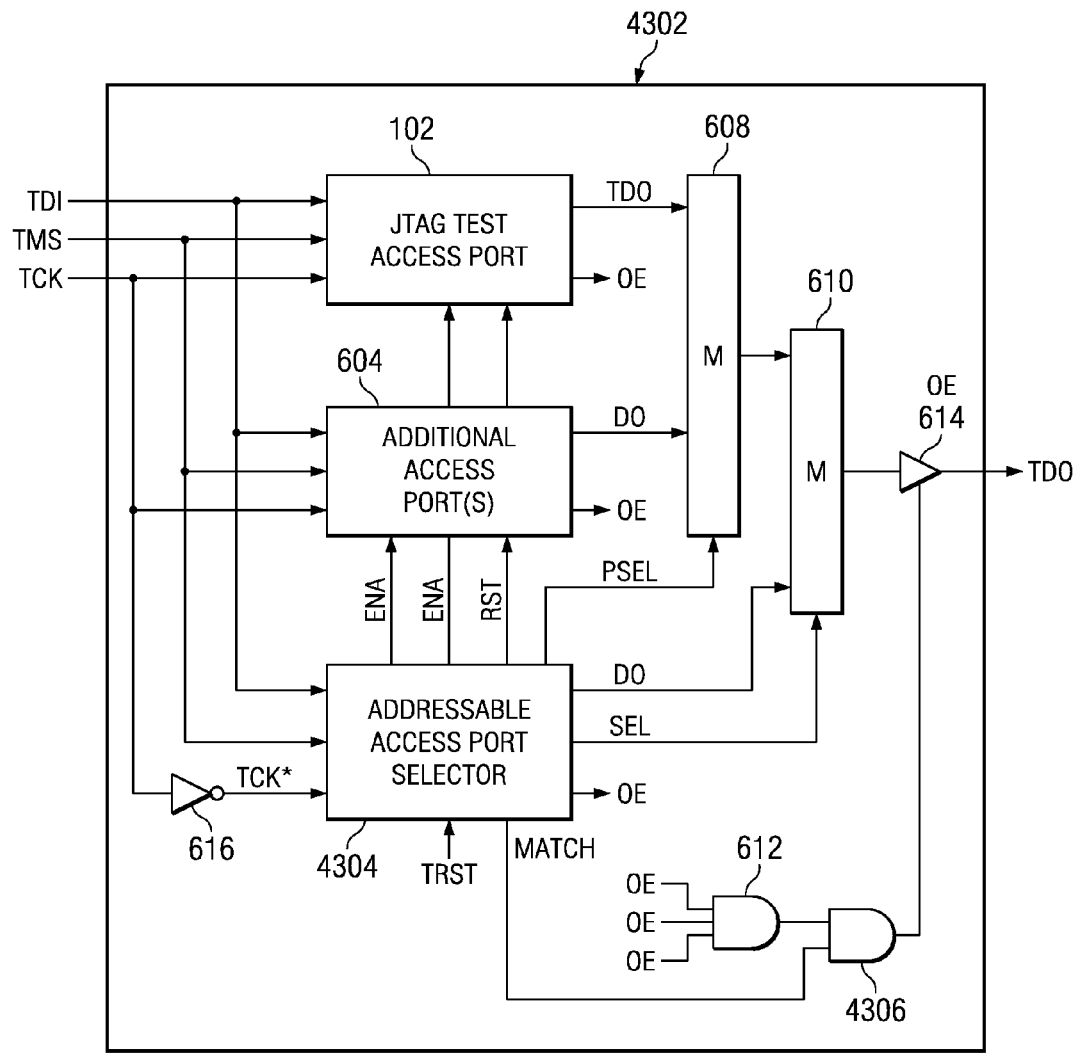
FIG. 43 illustrates an addressable access port selection architecture in a device according to the disclosure.

FIG. 43 illustrates a device 4302 containing an addressable access port selection architecture. The addressable access port selection architecture is the same as the access port selection architecture of FIG. 6 with the exception that the access port selector of FIG. 6 has been replaced with an addressable access port selector 4304 and a gate 4306 has been inserted between the output of OE gating 612 and the enable input of TDO buffer 614. As seen, the addressable access port selector 4304 contains all the signals of access port selector 606 plus a match signal, which is used to turn gate 4306 off and on. The addressable access port selection architecture of FIG. 43, as will be described below, advantageously allows for devices containing the addressable access port architecture to be accessed by a controller 4102 when the devices are connected to the controller in a serial daisy-chain arrangement or in a parallel addressable arrangement.

Figure 43A:
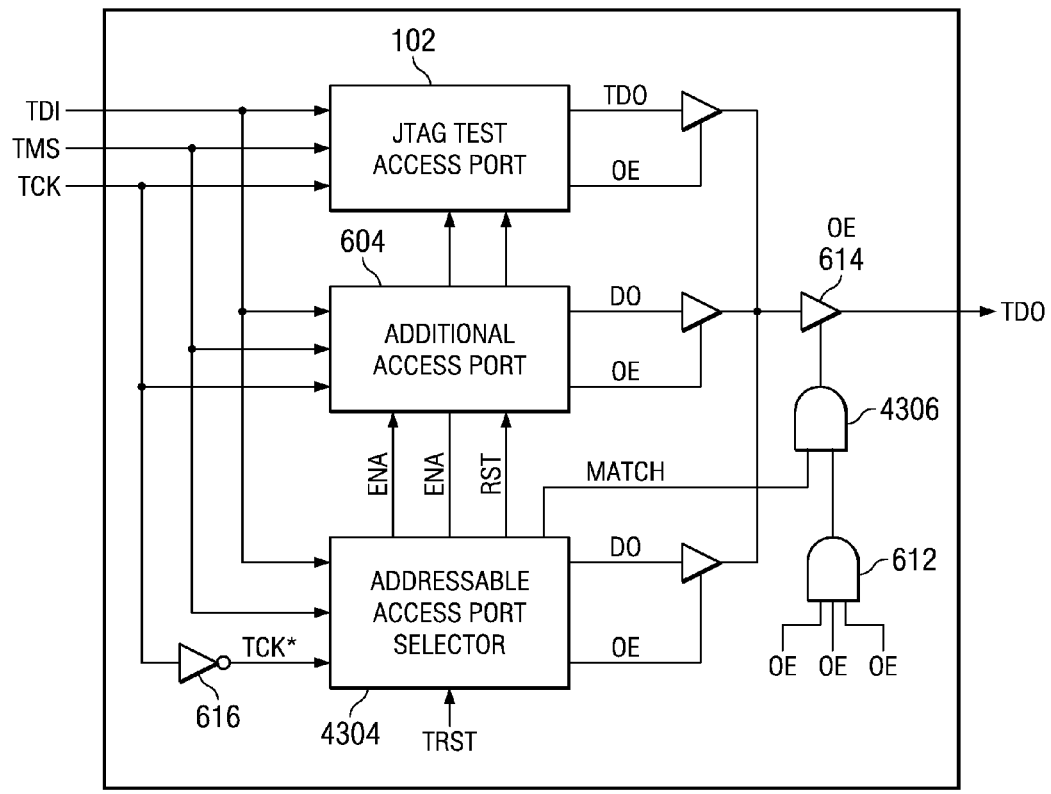
FIG. 43A illustrates an alternate addressable access port selection architecture in a device according to the disclosure.

FIG. 43A is provided to illustrate that the addressable access port selector 4304 could be used in the access port selection architecture 802 of FIG. 8 simply by replacing the access port selector 804 with the addressable access port selector 4304 and inserting gate 4306 between OE gating 612 and TDO buffer 614. As seen the PSEL and SEL signals of the addressable access port selector 4304 are not needed in the architecture of FIG. 43A since tri-state buffers are used instead of multiplexers to route data from a port to the TDO output.

Figure 44:
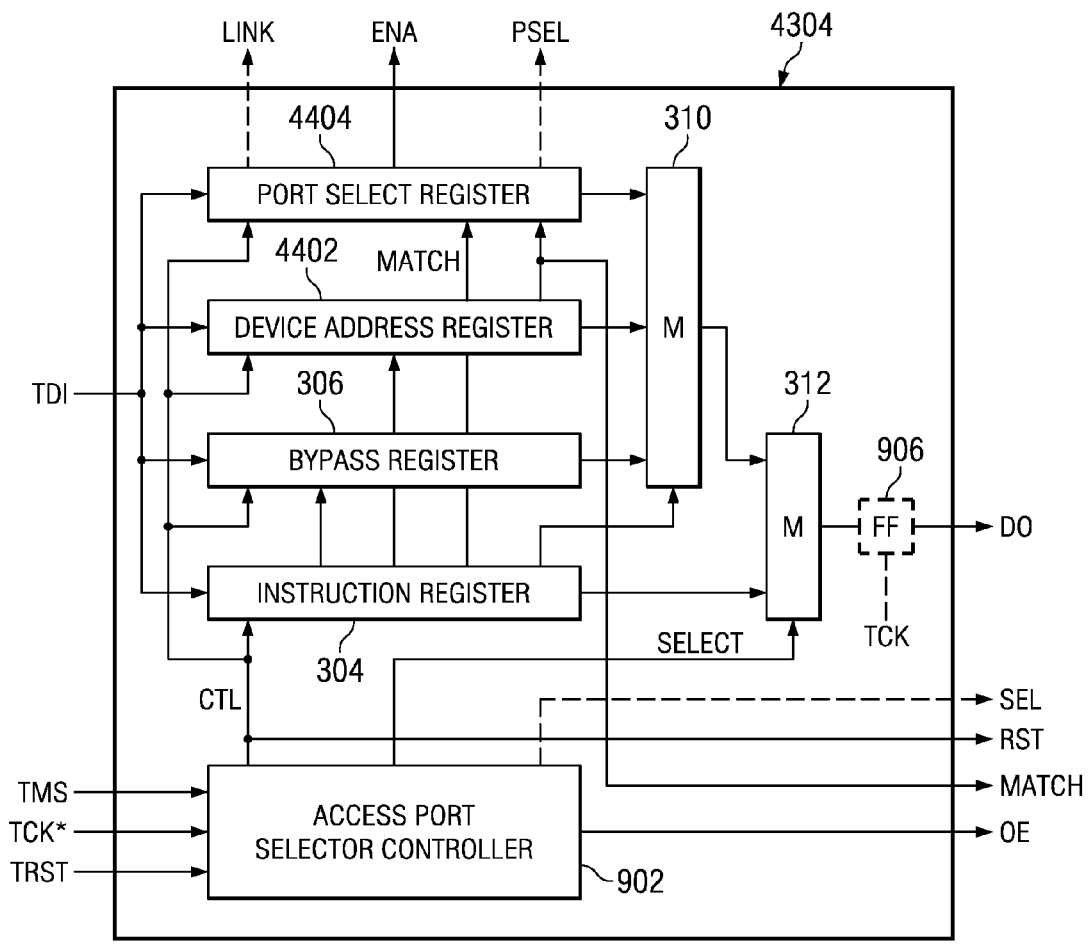
FIG. 44 illustrates an addressable access port selector according to the disclosure.

FIG. 44 illustrates the addressable access port selector 4304 of FIGS. 43 and 43A. As seen, selector 4304 is the same as the access port selector 902 of FIG. 9 with the exception that it contains a device address register 4402 and a modified port select register 4404. The device address register 4402 operates as the other registers to input data from TDI and output data to TDO via multiplexer 310 and 312 in response to control input from controller 902. The device address register 4402 outputs a match signal when it receives an address input on TDI that matches the device address in device address register 4402. The match signal is input to the port select register 4404 and is output from the addressable access port selector 4304 to gate 4306 of FIGS. 43 and 43A. The port select register 4404 is identical to the port select register 904 of FIG. 9 with the exception that it is enabled and disabled by the match signal input from device address register 4402. At power up or after a reset, the match signal is set to a disable state that disables update operations to the port select register 4404 and forces the output of gate 4306 to a state that tri-states the TDO buffer 614 of FIGS. 43 and 43A. When an address is input to the device address register 4402 that matches the device address the match signal is set to an enable state that enables update operations to the port select register 4404 and removes the forced tri-state condition on the TDO output buffer 614. When the match signal is set to the enable state, the addressable access port selector 4304 operates to select access ports in exactly the same way as the access port selector 606 of FIGS. 6 and 804 of FIG. 8.

Figure 45:
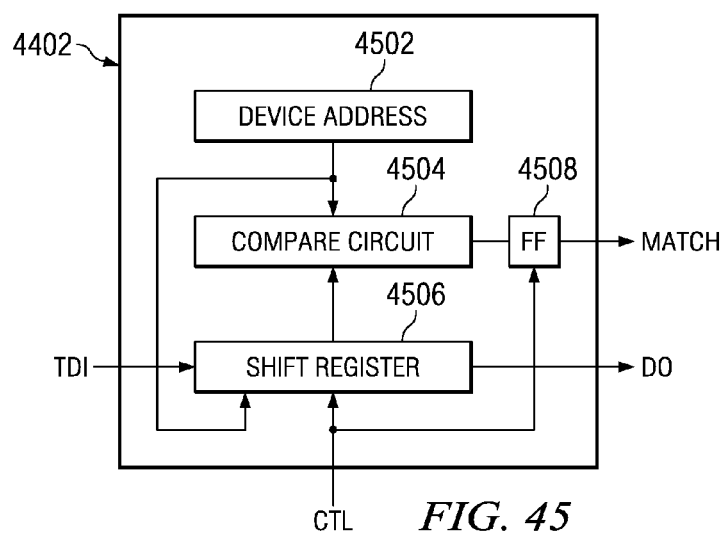
FIG. 45 illustrates a device address register according to the disclosure.

FIG. 45 illustrates an example implementation of the device address register 4402 of FIG. 44 which includes a device address circuit 4502, a compare circuit 4504, a shift register 4506, and a flip flop (FF) 4508 connected as shown. When capture control is input on the control (CTL) bus from the controller 902, the shift register captures the device address output from the device address circuit. When shift control is input on the CTL bus from controller 902, the shift register shifts data from TDI to DO/TDO to input a device address and to output the captured device address. When update control is input on the CTL bus from controller 902, the FF loads the match output from the comparator. If the device address shifted into the shift register matches the device address output from the device address circuit, the comparator outputs an enable state on the match output to FF 4508 that enables the operation of the port select register 4404 and removes the forced tri-state condition on the TDO output buffer 614 as mentioned in regard to FIG. 44. The match signal output from FF 4508 output will remain in the enable state until another capture, shift and update control sequence is input to the device address register 4402. In response to the another capture, shift and update control sequence, FF 4508 will again load the match output from the comparator and set the match output of the FF to either the disable state (address mismatch) or enable state (address match). In response to a reset input on the CTL bus from controller 902, the FF 4508 match output will be set to the disable state mentioned in regard to FIG. 44. Also in response to the reset input the shift register may optionally be reset to a state that does not match the device address.

It is important to note that when the shift register 4506 captures the device address output from the device address circuit 4502, it outputs the captured device address to the comparator. Following the capture operation, the device address output from the shift register is the same as the device address output from the device address circuit, which causes the match output from the comparator 4504 to be set to the enable state. If no shift operation occurs and the update operation follows the capture operation, the match output of FF 4508 will be set to the enable state during the update operation. Thus the match output of the device address register 4402 can be set to the enable state by simply performing a capture and update operation.

As will be described below, performing a capture and update operation enables devices with the addressable access port selection architecture of FIGS. 43 and 43A to operate in the serial daisy-chain arrangement of FIG. 48 and performing a capture, shift and update operation enables devices with the addressable access port selection architecture of FIGS. 43 and 43A to operate in the parallel addressable arrangement of FIG. 47.

Figure 46:
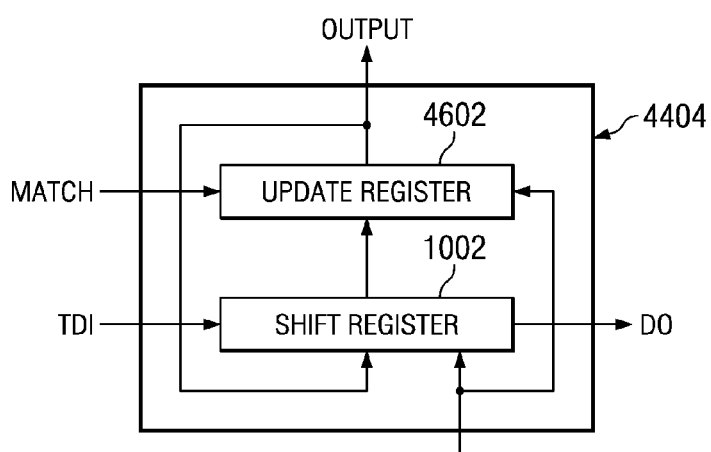
FIG. 46 illustrates a port select register according to the disclosure.

FIG. 46 illustrates an example implementation of the port select register 4404 of FIG. 44. The port select register 4404 is identical to the port selector 904 of FIG. 10 with the exception that the update register 1004 of FIG. 10 has been replaced with the update register 4602 of FIG. 46. Update register 4602 is the same as the update register 1004 with the exception that it includes an input for receiving the match signal from the device address register 4402. If the match signal is in the disable state mentioned in FIG. 44 the update register 4602 does not respond to update control inputs on the CTL bus of access port selector controller 902. If the match signal is in the enable state mentioned in FIG. 44 the update register 4602 responds to update control inputs on the CTL bus of access port selector controller 902. Thus the update register 4602 can only update its outputs with new data from shift register 1002 when the match signal is set to the enable state. The update register 4602 responds to a reset signal on the CTL bus as described in regard to the update register 1004 of FIG. 10.

Figure 47:
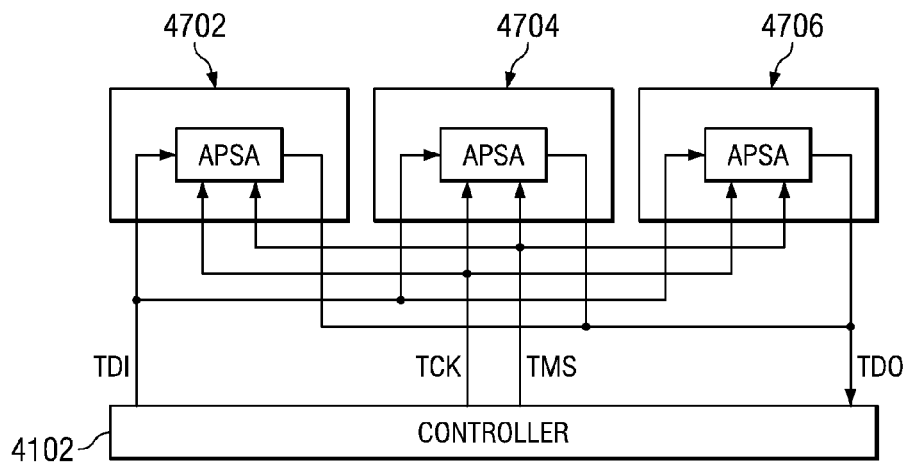
FIG. 47 illustrates a parallel connection between a controller and multiple devices, each device containing an addressable access port selection architecture according to the disclosure.

FIG. 47 illustrates an example interface between a controller 4102 and parallel devices 4702-4706, each device containing the addressable port selection architecture (APSA) described in regard to FIGS. 43 and 43A of this disclosure. The controller 4102 communicates with a selected one of the devices by inputting the device's address to all APSAs, using the capture, shift and update sequence described in regard to the device address register 4402 of FIG. 45. The APSA of the device having an address that matches the address input sets its match signal (FIG. 45) to the enable state. The APSAs of the non-addressed devices will set or keep their match signal in the disable state. Once a device APSA is selected by its match signal, the APSA can be operated by the controller 4102 to select a device access port for access using the port select register 4404 of FIG. 46 as previously described in this disclosure.

This process of selecting a device for access by inputting the device's address to all devices is repeated each time a different device is accessed. Since only one of the devices can be addressed (i.e. match signal set to the enable state) at a time, no contention occurs on the bussed device TDO outputs to the controller. Following a power up or a reset operation, none of the APSAs of devices 4702-4706 will be addressed (i.e. match signals of all APSAs are set to the disable state). Thus when the controller 4102 shifts a device address into the device APSAs following power up or reset, no TDO data will be output to the controller 4102 since all device TDO outputs will be tri-state by the disable state of the match signals.

Figure 48:
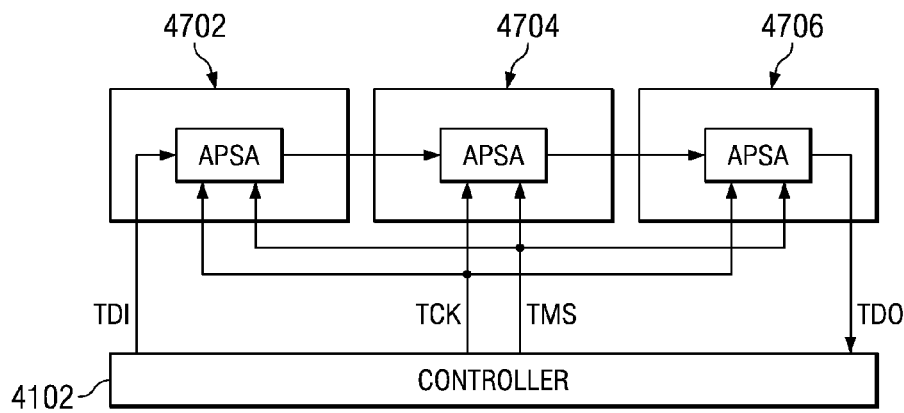
FIG. 48 illustrates a daisy-chain connection between a controller and multiple devices, each device containing an addressable access port selection architecture according to the disclosure.

FIG. 48 illustrates an example interface between a controller 4102 and serially daisy-chained devices 4702-4706. The devices 4702-4706 are the same devices shown in FIG. 47. The only difference is that the device 4702-4706 of FIG. 48 are arranged serially instead of in parallel as shown in FIG. 47. To enable serial access to all the devices of FIG. 48, the controller performs the capture and update sequence described in regard to FIG. 45 to set the match signals of all the devices APSAs to the enabled state. Once the initial capture and update sequence is performed, the controller can access all the device APSAs in the serial daisy-chain arrangement of FIG. 48 as described in the serial daisy-chain arrangement of FIG. 42.

The advantage of designing devices with the APSA of FIGS. 43 and 43A is that it enables the devices to be used in a device manufacturer's test environment or in a customer's system in either the parallel addressable access arrangement of FIG. 47 or the serial daisy-chain arrangement of FIG. 48. The parallel addressable access arrangement of FIG. 47 is enabled by performing the capture, shift and update sequence described in FIG. 45 to select an individual device for access and the serial daisy-chain access arrangement of FIG. 48 is enabled by performing the capture and update sequence described in FIG. 45 to select all the devices for access.

Figure 49:
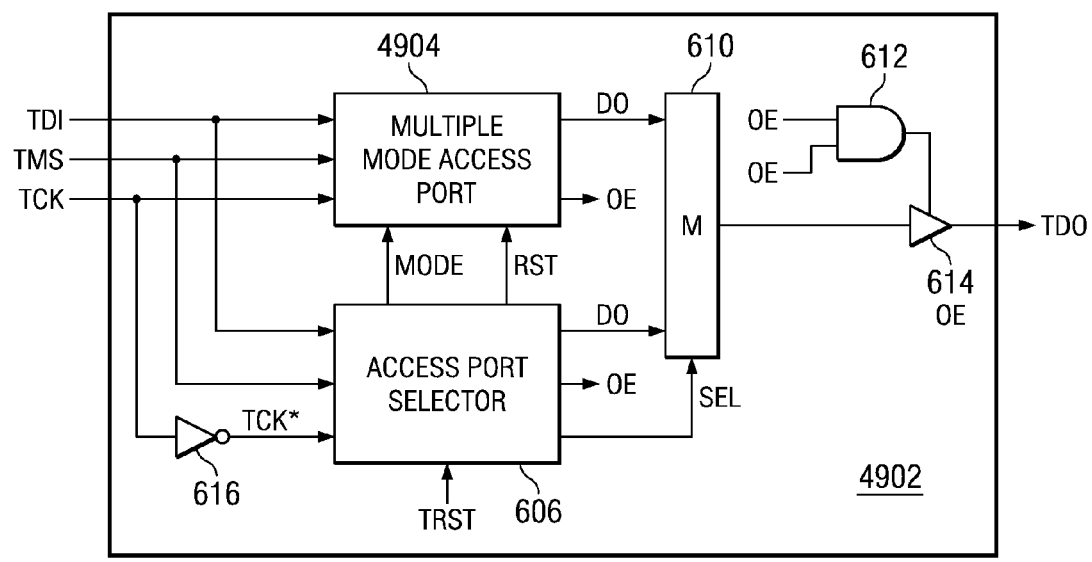
FIG. 49 illustrates an access port selection architecture in a device containing a multiple mode access port and an access port selector according to the disclosure.

FIG. 49 illustrates a device 4902 including another type of device access port architecture according to this disclosure. The access architecture is similar to the access architecture of FIG. 6 in that it comprises an access port selector 606, OE gating 612, TDO output buffer 614, a multiplexer 610, and TCK inverter 616. The architecture of FIG. 49 differs from the architecture of FIG. 6 in that it contains a single multiple mode access port 4904, instead of separate access ports 102 and 604. As with the separate access ports 102 and 604, the multiple mode access port 4904 responds to TMS on the rising edge of TCK to perform an access port operation. The multiple mode access port 4904 inputs mode control signals from access port selector 606 to program the access port 4904 for different types of access port operations, including but not limited to the JTAG TAP 102 operation of this disclosure, the JTAG compliant access port 1504 operation of this disclosure, the JTAG compatible access port 1506 operation of this disclosure, and the non-JTAG access port 1508 of this disclosure. The mode control signals come from the update register 1004 of the port select register 904 of FIGS. 9 and 10 and replaces the ENA and PBSEL signals. The mode control signals are established by accessing the access port controller 606 on the falling edge of TCK as described in this disclosure to shift in and update a desired mode control signal pattern from the port select register 904 to the mode control inputs of the multiple mode access port 4904. In response to the mode control input, the multiple mode access port is programmed or otherwise configured to operate as one of the above mentioned access ports 102 and 1504-1508. Each different access port operation of the multiple mode access port 4904 will be enabled by a unique pattern on the mode control input from the access port selector 606. At device power up or in response to a TRST signal or a TMS reset sequence, the multiple mode access port 4904 will receive mode control input from the access port selector 606 to cause the multiple mode access port to operate as the JTAG TAP 102 for the reasons mentioned in regard to FIG. 10.

Figure 50:
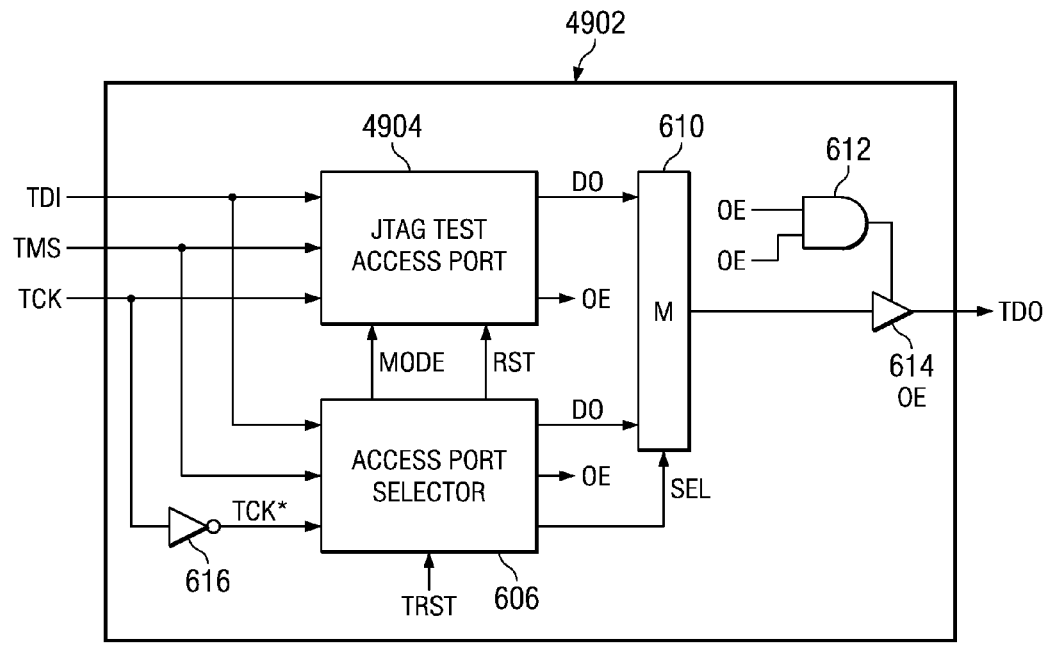
FIG. 50 illustrates the access port selection architecture of FIG. 49 where the access port selector selects the multiple mode access port to be a JTAG test access port according to the disclosure.

FIG. 50 illustrates the device 4902 with the multiple mode access port 4904 programmed or otherwise configured, via a first mode control input pattern from access port selector 606, to operate as a JTAG TAP 102 according to this disclosure.

Figure 51:
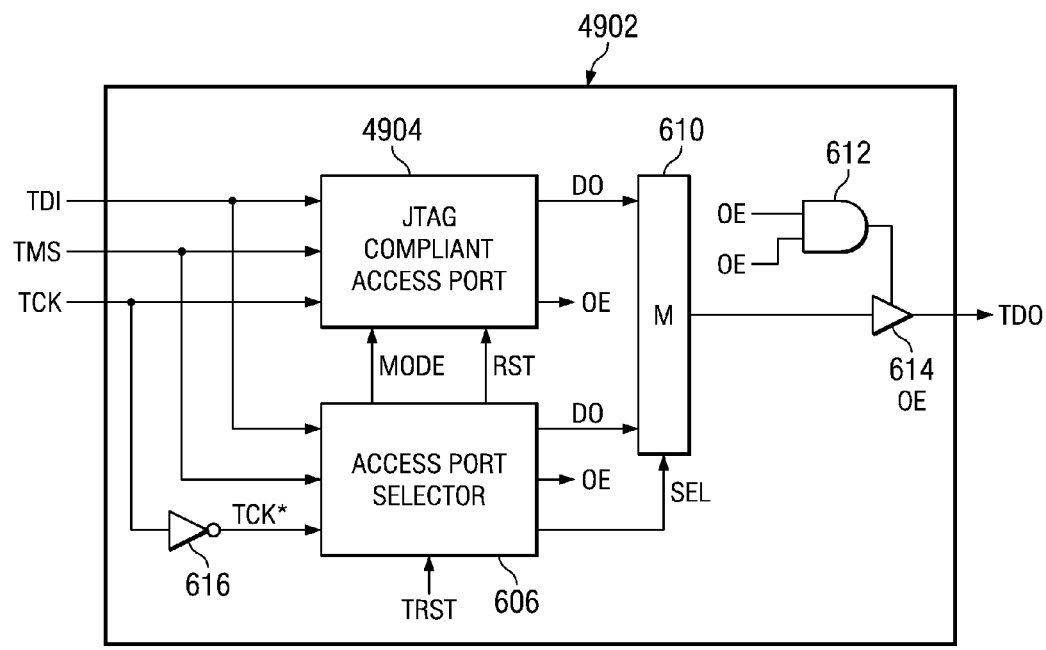
FIG. 51 illustrates the access port selection architecture of FIG. 49 where the access port selector selects the multiple mode access port to be a JTAG compliant access port according to the disclosure.

FIG. 51 illustrates the device 4902 with the multiple mode access port 4904 programmed or otherwise configured, via a second mode control input pattern from access port selector 606, to operate as a JTAG compliant access port 1504 according to this disclosure.

Figure 52:
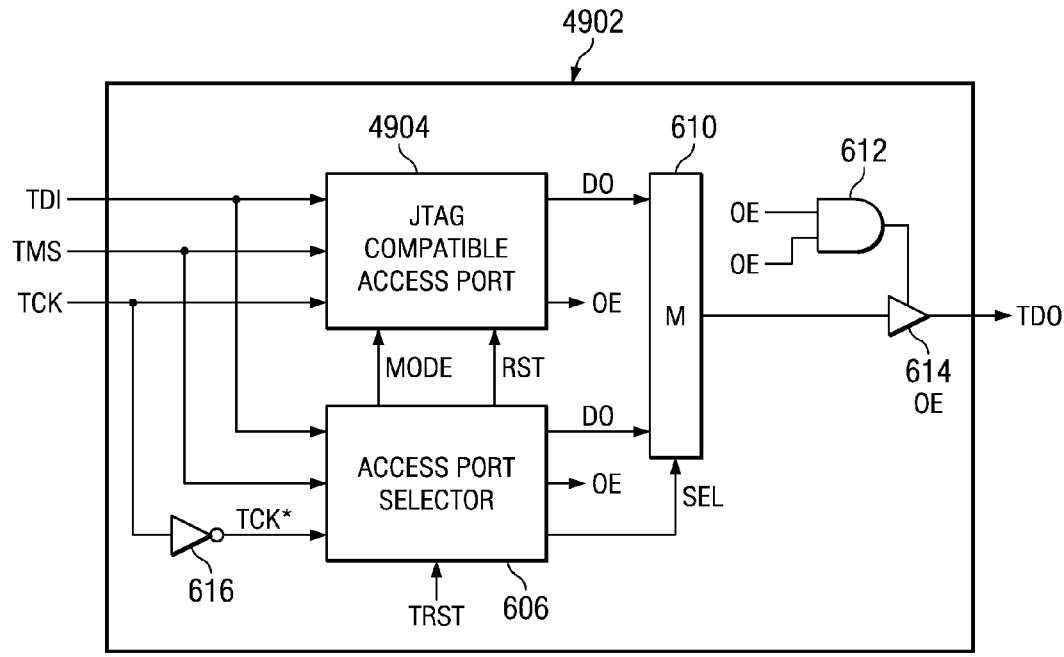
FIG. 52 illustrates the access port selection architecture of FIG. 49 where the access port selector selects the multiple mode access port to be a JTAG compatible access port according to the disclosure.

FIG. 52 illustrates the device 4902 with the multiple mode access port 4904 programmed or otherwise configured, via a third mode control input pattern from access port selector 606, to operate as a JTAG compatible access port 1506 according to this disclosure.

Figure 53:
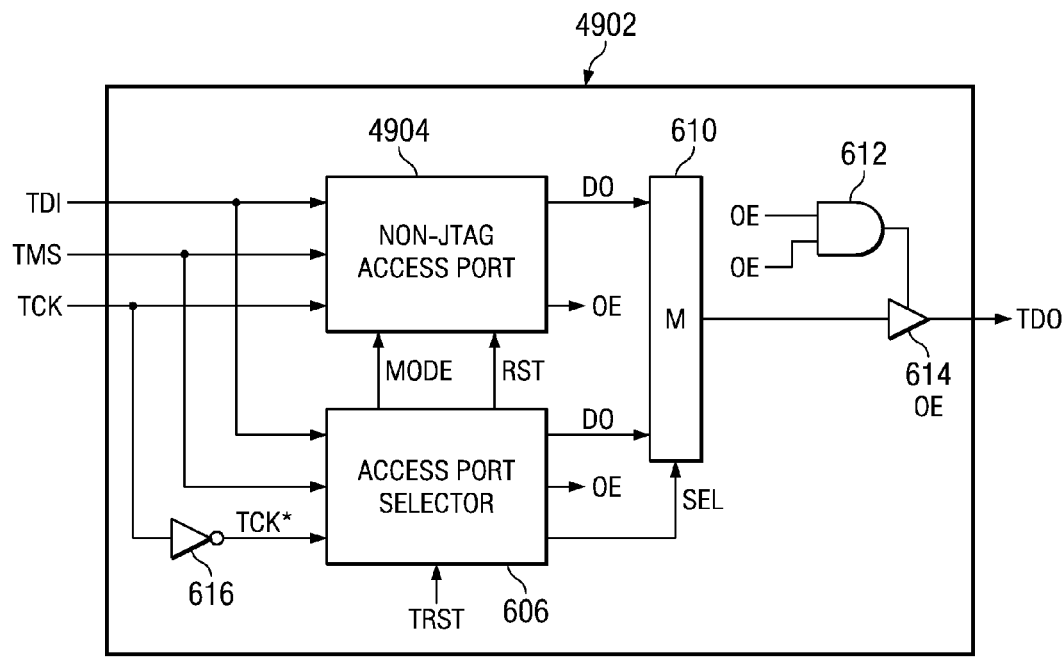
FIG. 53 illustrates the access port selection architecture of FIG. 49 where the access port selector selects the multiple access mode access port to be non-JTAG access port according to the disclosure.

FIG. 53 illustrates the device 4902 with the multiple mode access port 4904 programmed or otherwise configured, via a fourth mode control input pattern from access port selector 606, to operate as a non-JTAG access port 1508 according to this disclosure.

Figure 54:
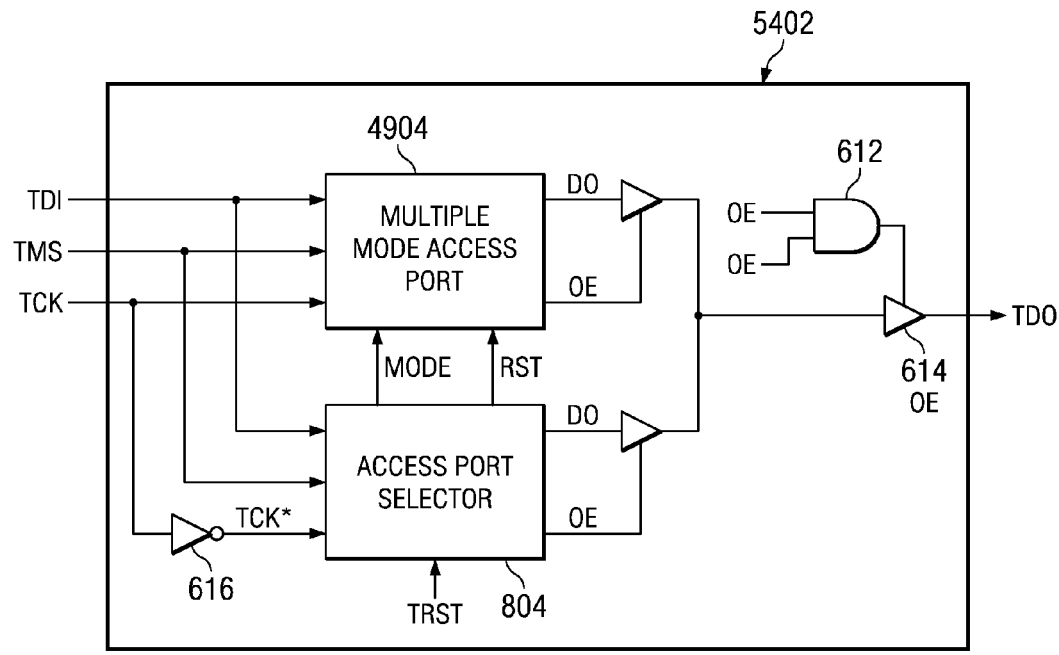
FIG. 54 illustrates an alternate access port selection architecture in a device containing a multiple mode access port and an access port selector according to the disclosure.

FIG. 54 is provided to illustrate that a device 5402 may contain a multiple mode access port 4904 that is controlled by the access port selector 804 of FIG. 8. The operation of the multiple mode access port in response to mode control input from access port selector 804 is the same as described in FIGS. 49-53. The main difference is that tri-state buffers, instead of multiplexer 610, are used to couple the DO from the access port selector 804 or the DO from the multiple mode access port to the device TDO via buffer 614.

Figure 55:
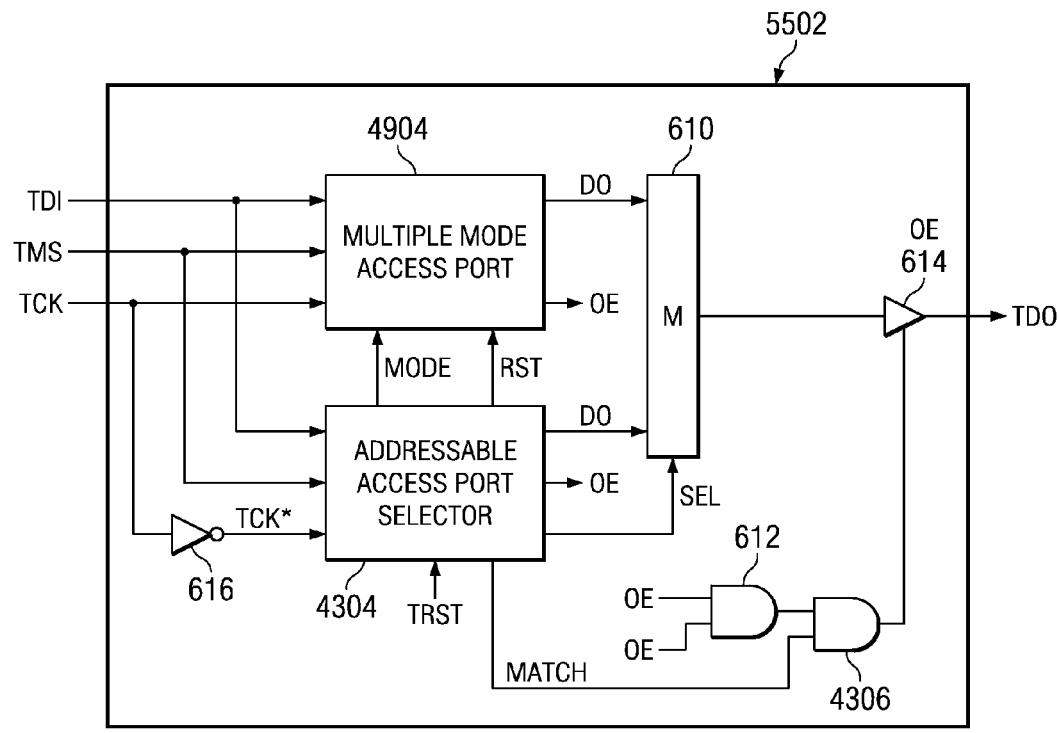
FIG. 55 illustrates an access port selection architecture in a device containing a multiple mode access port and an addressable access port selector according to the disclosure.

FIG. 55 is provided to illustrate that a device 5502 may contain a multiple mode access port 4904 that is controlled by the addressable access port selector 4304 of FIGS. 43 and 43A. The operation of the multiple mode access port in response to mode control input from access port selector 4304 is the same as described in FIGS. 49-53. The main difference is that multiple devices 5502 can be used in a parallel addressable arrangement as described in regard to FIG. 47 or in a serial daisy-chain arrangement as described in regard to FIG. 48.

It is important to note that while this disclosure has described the rising edge operated device access ports and the falling edge operated device access port selector as being interfaced to a device's JTAG TDI, TMS, TCK, and TDO interface terminals, it is not limited to use with these JTAG interface terminals. Indeed, the rising edge access ports and the falling edge access port selector of the disclosure may be interfaced to any device interface terminal signal group that includes a signal for inputting data, like TDI, a signal for inputting a clock, like TCK, a signal for inputting a mode control, like TMS, and a signal for outputting data, like TDO.

It is also important to note that while this disclosure has described the falling edge operated access port selector as a circuit for selecting access to rising edge operated access ports related to the JTAG test access port, the access port selector is not limited to selecting access to access ports related to the JTAG test access port. Indeed, the falling edge operated access port selector of this disclosure may be used to select access to any type of rising edge operated access port in a device.

Further, while this disclosure has described operating device access ports on the rising edge of a clock and operating device access port selectors on the falling edge of the clock, it should be understood that the clock edges could be reversed such that device access ports operate on the falling edge and device access port selectors operate on the rising edge as well.

Although the disclosure has been described in detail, it should be understood that various changes, substitutions and alterations may be made without departing from the spirit and scope of the disclosure as defined by the appended claims.

ASPECTS OF THE DISCLOSURE

Aspect 1 (FIG. 6)

An electrical device comprising:

a TDI input terminal, TMS input terminal, TCK input terminal, and TDO output terminal, a first access port having an input connected to the TDI input terminal, an input connected to the TMS input terminal, an input connected to the TCK input terminal, an enable input, and a data output, a second access port having an input connected to the TDI input terminal, an input connected to the TMS input terminal, an input connected to the TCK input terminal, an enable input, and a data output, an access port selector having an input connected to the TDI input terminal, an input connected to the TMS input terminal, an input coupled to the TCK input terminal via an inverter, a first enable output connected to the enable input of the first access port, a second enable output connected to the enable input of the second access port, control outputs, and a data output, and;

multiplexer circuitry having a data input connected to the data output of the first access port, a data input connected to the data output of the second access port, a data input connected to the data output of the access port selector, control inputs connected to the control outputs of the access port selector, and a data output coupled to the TDO output terminal.

Aspect 2 (FIG. 15)

The electrical device of ASPECT 1 wherein the first access port is a JTAG (IEEE 1149.1 standard) test access port and the second access port is one of a JTAG compliant access port, a JTAG compatible access port, and a non-JTAG access port.

Aspect 3 (FIG. 8)

An electrical device comprising:

a TDI input terminal, TMS input terminal, TCK input terminal, and TDO output terminal, a first access port having an input connected to the TDI input terminal, an input connected to the TMS input terminal, an input connected to the TCK input terminal, an enable input, an output enable output, and a data output, a second access port having an input connected to the TDI input terminal, an input connected to the TMS input terminal, an input connected to the TCK input terminal, an enable input, an output enable output, and a data output, an access port selector having an input connected to the TDI input terminal, an input connected to the TMS input terminal, an input coupled to the TCK input terminal via an inverter, a first enable output connected to the enable input of the first access port, a second enable output connected to the enable input of the second access port, an output enable output, and a data output, and;

a first tri-state buffer having a data input connected to the data output of the first access port, an enable input connected to the output enable output of the first access port, and a data output, a second tri-state buffer having a data input connected to the data output of the second access port, an enable input connected to the output enable output of the second access port, and a data output, a third tri-state buffer having a data input connected to the data output of the access port selector, an enable input connected to the output enable output of the access port selector, and a data output, and;

a fourth tri-state buffer having a data input connected to the data outputs of the first, second and third tri-state buffers and a data output connected to the TDO output terminal.

Aspect 4 (FIG. 16)

The electrical device of ASPECT 3 wherein the first access port is a JTAG (IEEE 1149.1 standard) test access port and the second access port is one of a JTAG compliant access port, a JTAG compatible access port, and a non-JTAG access port.

Aspect 5 (FIG. 7)

A process of operating an access port in a device and an access port selector in the device from a common clock comprising the steps of:

operating the access port in response to a first edge of the common clock, and;

operating the access port selector in response to a second edge of the common clock.

Aspect 6 (FIG. 9)

An access port selector in a device for enabling access to a selected one of plural access ports in the device comprising:

an access port selector controller operable in response to an input from a TMS terminal of the device on the falling edge of a clock input from a TCK terminal of the device to output instruction and data register control signals, an instruction register responsive to the instruction register control signals to serially input an instruction from a TDI terminal of the device and to update the serially input instruction on parallel outputs of the instruction register, and;

an access port select register selectively responsive to the data register control signals to serially input port selection data from the TDI terminal of the device and to update the serially input port selection data on parallel outputs of the access port select register.

Aspect 7 (FIG. 9)

The access port selector of ASPECT 6 further comprising a bypass register selectively responsive to the data register control signals to serially input bypass data from the TDI terminal and to pass the bypass data to a TDO terminal of the device.

Aspect 8 (FIG. 11)

An access port selector in a device for enabling access to a selected one of plural access ports in the device comprising:

an access port selector controller operable in response to an input from a TMS terminal of the device on the falling edge of a clock input from a TCK terminal on the device to shift access port selection data into an access port select register from a TDI terminal of the device and to update the access port selection data to parallel outputs of the access port select register.

Aspect 9 (FIGS. 17 and 18)

A JTAG compatible access port in a device comprising:

a JTAG compatible access port controller compatibly operable in response to TMS and TCK signals in at least the Test Logic Reset, Shift-DR, Shift-IR and Update-IR states of the standard JTAG/1149.1 test access port state diagram, an instruction register operable to shift data when the JTAG compatible access port controller is operating in the Shift-IR state, to update data when the JTAG compatible access port controller is operating in the Update-IR state, and to reset the JTAG compatible access port when the JTAG compatible access port is operating in the Test Logic Reset state, and;

a data register operable to shift data when the JTAG compatible access port controller is operating in the Shift-DR state.

Aspect 10 (FIGS. 19 and 18)

A JTAG compatible access port in a device comprising:

a JTAG compatible access port controller compatibly operable in response to TMS and TCK signals in at least the Test Logic Reset, Shift-DR, Shift-IR and Update-IR states of the standard JTAG/1149.1 test access port state diagram, a data register operable to shift data when the JTAG compatible access port controller is operating in the Shift-DR state, and;

an instruction bypass register operable to shift data when the JTAG compatible access port controller is operating in the Shift-IR state.

Aspect 11 (FIGS. 24, 22, and 23A-23C)

A non-JTAG access port in a device comprising:

an access port controller that operates in response to TMS and TCK signals according to a state diagram that is different from the standard JTAG/1149.1 test access port state diagram to output instruction and data register control signals, an instruction register responsive to the instruction register control signals to capture, shift and update instruction data, and;

a data register selectively responsive to the data register control signals to perform one of a capture, shift and update operation, a capture and shift operation, and a shift and update operation.

Aspect 12 (FIG. 21)

The non-JTAG access port of ASPECT 11 further comprising a bypass register selectively responsive to the data register control signals to shift data.

Figure 26:
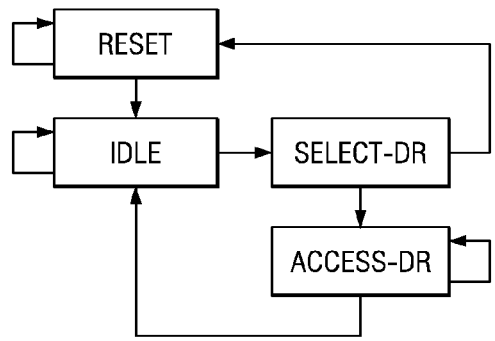
FIG. 26 illustrates an operational state diagram for a non-JTAG access port according to the disclosure.
Figure 27:
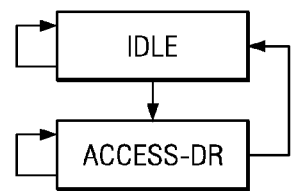
FIG. 27 illustrates an operational state diagram for a non-JTAG access port according to the disclosure.

Aspect 13 (FIGS. 25, 26, and 27)

A non-JTAG access port in a device comprising:

an access port controller that operates in response to TMS and TCK signals according to a state diagram that is different from the standard JTAG/1149.1 test access port state diagram to output data register control signals, and;

a data register responsive to the data register control signals to perform one of a capture, shift and update operation, a capture and shift operation, and a shift and update operation.

Aspect 14 (FIG. 28)

A non-JTAG access port in a device comprising:

an access port interface having an input connected to a TMS signal, an input connected to a TCK signal, an input connected to an enable signal, an output connected to a load/shift (L/S) signal, and an output connected to a clock (CLK) signal, said access port interface coupling the TMS signal to the load/shift signal and the TCK signal to the clock signal when the enable input is set to a first logic level and coupling the load/shift signal and the clock signals to static logic levels when the enable signal is set to a second logic level, and;

a data register having an input connected to a TDI signal, an input connected to the load/shift signal, an input connected to the clock signal, parallel data input signals, parallel data output signals, and a data output signal.

Aspect 15 (FIG. 29)

A non-JTAG access port in a device comprising:

an access port interface having an input connected to a TMS signal, an input connected to a TCK signal, an input connected to a functional clock (FCK) signal, an input connected to an enable signal, an output connected to a load/shift (L/S) signal, and an output connected to a clock (CLK) signal, said access port interface coupling the TMS signal to the load/shift signal and the TCK signal to the clock signal when the enable input is set to a first logic level and coupling the load/shift signal to a static logic level and the clock signal to the FCK when the enable signal is set to a second logic level, a data register having an input connected to a TDI signal, an input connected to the load/shift signal, an input connected to the clock signal, parallel data input signals, parallel data output signals, and a data output signal, and;

combinational logic having inputs connected to the parallel data output signals and outputs connected to the parallel data input signals.

Aspect 16 (FIGS. 30 and 32)

An electrical device comprising:

a TDI input terminal, TMS input terminal, TCK input terminal, and TDO output terminal, a first access port having an input connected to the TDI input terminal, an input connected to the TMS input terminal, an input connected to the TCK input terminal, an enable input, and a data output, a second access port having a data input, an input connected to the TMS input terminal, an input connected to the TCK input terminal, an enable input, and a data output, an access port selector having an input connected to the TDI input terminal, an input connected to the TMS input terminal, an input coupled to the TCK input terminal via an inverter, enable outputs connected to the enable inputs of the first and second access ports, control outputs, and a data output, a multiplexer having an input connected to the data output of the first access port, an input connected to the TDI input terminal, a control input connected to the control outputs of the access port selector, and a data output connected to the data input of the second access port, and;

multiplexer circuitry having data inputs connected to the data outputs of the first and second access ports, control inputs connected to the control outputs of the access port selector, and a data output coupled to the TDO output terminal.

Aspect 17 (FIG. 33)

A data register of an access port that is enabled by an access port selector comprising: a shift register having a TDI input, CTL inputs, parallel data outputs connected to a circuit destination, parallel data inputs connected to a circuit source, and a data output.

Aspect 18 (FIG. 34)

A data register of an access port that is enabled by an access port selector comprising: a shift register having a TDI input, CTL inputs, parallel data outputs connected to a circuit destination, and a data output.

Aspect 19 (FIG. 35)

A data register of an access port that is enabled by an access port selector comprising: a shift register having a TDI input, CTL inputs, parallel data inputs connected to a circuit source, and a data output.

Aspect 20 (FIG. 36)

A data register of a device access port that is enabled by a device access port selector comprising:

a shift register having a TDI input, CTL inputs, parallel data outputs, parallel data inputs connected to a circuit source, and a data output, and;

an update register having parallel data inputs connected to the parallel data outputs, parallel data outputs connected to a circuit destination, and CTL inputs.

Aspect 21 (FIG. 37)

A data register of a device access port that is enabled by a device access port selector comprising:

a shift register having a TDI input, CTL inputs, parallel data outputs, and a data output, and;

an update register having parallel data inputs connected to the parallel data outputs, and CTL inputs.

Aspect 22 (FIG. 38)

A data register of a device access port that is enabled by a device access port selector comprising:

a test data decompressor (D) having a TDI input, CTL inputs, and scan data outputs, a test data compactor circuit (C), having scan data inputs, CTL inputs, and a data output, and;

plural scan registers each having a scan data input coupled to a respective one of the scan data outputs of the test data decompressor, CTL inputs, and a scan data output coupled to a respective one of the scan data inputs of the test data compactor.

Aspect 23 (FIG. 39)

A data register of a device access port that is enabled by a device access port selector comprising:

a first device select module (DSM) having a serial input (SI) connected to a TDI signal, CTL inputs, a data output (DO), control outputs (C), a data input (DI), and a serial output (SO), a second device select module having a serial input connected to the serial output of the first device select module, CTL inputs, a data output, control outputs, a data input, and a serial output, a first instrument having a data input connected to the data output of the first device select module, control inputs connected to the control outputs of the first device select module, and a data output connected to the data input of the first device select module, and;

a second instrument having a data input connected to the data output of the second device select module, control inputs connected to the control outputs of the second device select module, and a data output connected to the data input of the second device select module.

Aspect 24 (FIG. 41)

An arrangement between a device containing an access port selection architecture and controller for accessing the device access port selection architecture comprising:

a device having a TDI input, a TCK input, a TMS input, and a TDO output, a controller having a TDI output, a TCK output, a TMS output, and a TDO input, and;

a first connection between the controller TDI output and device TDI input, a second connection between the controller TCK output and the device TCK input, a third connection between the controller TMS output and the device TMS input, and;

a fourth connection between the controller TDO input and the device TDO output.

Aspect 25 (FIG. 42)

An arrangement between daisy-chained devices, each containing an access port selection architecture, and controller for accessing the device access port selection architectures comprising:

a controller having a TDI output, a TCK output, a TMS output, and a TDO input, a first device having a TDI input connected to the TDI output of the controller, a TCK input connected to the TCK output of the controller, a TMS input connected to the TMS output of the controller, and a TDO output, and;

a second device having a TDI input connected to the TDO output of the first device, a TCK input connected to the TCK output of the controller, a TMS input connected to the TMS output of the controller, and a TDO output coupled to the TDO input of the controller.

Aspect 26 (FIG. 43)

An electrical device comprising:

a TDI input terminal, TMS input terminal, TCK input terminal, and TDO output terminal, a first access port having an input connected to the TDI input terminal, an input connected to the TMS input terminal, an input connected to the TCK input terminal, an enable input, and a data output, a second access port having an input connected to the TDI input terminal, an input connected to the TMS input terminal, an input connected to the TCK input terminal, an enable input, and a data output, an addressable access port selector having an input connected to the TDI input terminal, an input connected to the TMS input terminal, an input coupled to the TCK input terminal via an inverter, a first enable output connected to the enable input of the first access port, a second enable output connected to the enable input of the second access port, a match output, control outputs, and a data output, and;

multiplexer circuitry having a data input connected to the data output of the first access port, a data input connected to the data output of the second access port, a data input connected to the data output of the access port selector, control inputs connected to the control outputs of the access port selector, and a data output coupled to the TDO output terminal.

Aspect 27 (FIG. 43)

The electrical device of ASPECT 27 wherein the first access port is a JTAG (IEEE 1149.1 standard) test access port and the second access port is one of a JTAG compliant access port, a JTAG compatible access port, and a non-JTAG access port.

Aspect 28 (FIG. 43A)

An electrical device comprising:

a TDI input terminal, TMS input terminal, TCK input terminal, and TDO output terminal, a first access port having an input connected to the TDI input terminal, an input connected to the TMS input terminal, an input connected to the TCK input terminal, an enable input, an output enable output, and a data output, a second access port having an input connected to the TDI input terminal, an input connected to the TMS input terminal, an input connected to the TCK input terminal, an enable input, an output enable output, and a data output, an addressable access port selector having an input connected to the TDI input terminal, an input connected to the TMS input terminal, an input coupled to the TCK input terminal via an inverter, a first enable output connected to the enable input of the first access port, a second enable output connected to the enable input of the second access port, an output enable output, an match output, and a data output, and;

a first tri-state buffer having a data input connected to the data output of the first access port, an enable input connected to the output enable output of the first access port, and a data output, a second tri-state buffer having a data input connected to the data output of the second access port, an enable input connected to the output enable output of the second access port, and a data output, a third tri-state buffer having a data input connected to the data output of the access port selector, an enable input connected to the output enable output of the access port selector, and a data output, and;

a fourth tri-state buffer having a data input connected to the data outputs of the first, second and third tri-state buffers and a data output connected to the TDO output terminal.

Aspect 29 (FIG. 43A)

The electrical device of ASPECT 28 wherein the first access port is a JTAG (IEEE 1149.1 standard) test access port and the second access port is one of a JTAG compliant access port, a JTAG compatible access port, and a non-JTAG access port.

Aspect 30 (FIG. 44)

An addressable access port selector in a device for enabling access to a selected one of plural access ports in the device comprising:

an access port selector controller operable in response to an input from a TMS terminal of the device on the falling edge of a clock input from a TCK terminal of the device to output instruction and data register control signals, an instruction register responsive to the instruction register control signals to serially input an instruction from a TDI terminal of the device and to update the serially input instruction on parallel outputs of the instruction register, a device address register selectively responsive to the data register control signals to serially input address data from the TDI terminal of the device, comparing the input address to the address of the device, and in response to the addresses being the same, asserting a match signal output from the device address register, and;

an access port select register selectively responsive to the data register control signals to serially input port selection data from the TDI terminal of the device and to update, if the match signal is asserted, the serially input port selection data on parallel outputs of the access port select register.

Aspect 31 (FIG. 44)

The addressable access port selector of ASPECT 30 further comprising a bypass register selectively responsive to the data register control signals to serially input bypass data from the TDI terminal and to pass the bypass data to a TDO terminal of the device.

Aspect 32 (FIG. 45)

A device address register comprising:

a shift register having a serial input, parallel inputs, control inputs, parallel outputs and a serial output, a device address providing circuit having parallel outputs, a compare circuit having first and second parallel inputs and a match output, a flip flop having a data input, a control input, and a data output, and;

connections formed between the parallel inputs of the shift register and parallel outputs of the device address providing circuit, between the parallel outputs of the shift register and the first parallel inputs of the compare circuit, between the parallel outputs of the device address providing circuit and the second parallel inputs of the compare circuit, and between the match output of the compare circuit and the data input of the flip flop.

Aspect 33 (FIG. 46)

A port select register comprising:

a shift register having a serial input, parallel inputs, control inputs, parallel outputs and a serial output, an update register having parallel inputs, an enable input, control inputs, and parallel outputs, and;

connections formed between the parallel inputs of the shift register and parallel outputs of the update register, and between the parallel outputs of the shift register and the parallel inputs of the update register.

Aspect 34 (FIG. 47)

An arrangement between multiple devices, each containing an addressable access port selection architecture, and controller for accessing the device's addressable access port selection architecture comprising:

a controller having a TDI output, a TCK output, a TMS output, and a TDO input, a first device having a TDI input connected to the TDI output of the controller, a TCK input connected to the TCK output of the controller, a TMS input connected to the TMS output of the controller, and a TDO output connected to the TDO input of the controller, and;

a second device having a TDI input connected to the TDO output of the controller, a TCK input connected to the TCK output of the controller, a TMS input connected to the TMS output of the controller, and a TDO output coupled to the TDO input of the controller.

Aspect 35 (FIG. 48)

An arrangement between multiple devices, each containing an addressable access port selection architecture, and controller for accessing the device's addressable access port selection architecture comprising:

a controller having a TDI output, a TCK output, a TMS output, and a TDO input, a first device having a TDI input connected to the TDI output of the controller, a TCK input connected to the TCK output of the controller, a TMS input connected to the TMS output of the controller, and a TDO output, and;

a second device having a TDI input connected to the TDO output of the first device, a TCK input connected to the TCK output of the controller, a TMS input connected to the TMS output of the controller, and a TDO output coupled to the TDO input of the controller.

Aspect 36 (FIG. 49)

An electrical device comprising:

a TDI input terminal, TMS input terminal, TCK input terminal, and TDO output terminal, a multiple mode access port having an input connected to the TDI input terminal, an input connected to the TMS input terminal, an input connected to the TCK input terminal, mode inputs, and a data output, an access port selector having an input connected to the TDI input terminal, an input connected to the TMS input terminal, an input coupled to the TCK input terminal via an inverter, mode outputs connected to the mode inputs of the multiple mode access port, a control output, and a data output, and;

a multiplexer having a data input connected to the data output of the multiple mode access port, a data input connected to the data output of the access port selector, a control input connected to the control output of the access port selector, and a data output coupled to the TDO output terminal.

Aspect 37 (FIG. 50)

The multiple mode access port of ASPECT 36 wherein the multiple mode access port operates as a JTAG test access port in response to a first mode input pattern.

Aspect 38 (FIG. 51)

The multiple mode access port of ASPECT 36 wherein the multiple mode access port operates as a JTAG complaint access port in response to a second mode input pattern.

Aspect 39 (FIG. 52)

The multiple mode access port of ASPECT 36 wherein the multiple mode access port operates as a JTAG compatible access port in response to a third mode input pattern.

Aspect 40 (FIG. 53)

The multiple mode access port of ASPECT 36 wherein the multiple mode access port operates as a non-JTAG access port in response to a fourth mode input pattern.

Aspect 41 (FIG. 54)

An electrical device comprising:

a TDI input terminal, TMS input terminal, TCK input terminal, and TDO output terminal, a multiple mode access port having an input connected to the TDI input terminal, an input connected to the TMS input terminal, an input connected to the TCK input terminal, mode inputs, and output enable output, and a data output, an access port selector having an input connected to the TDI input terminal, an input connected to the TMS input terminal, an input coupled to the TCK input terminal via an inverter, mode outputs connected to the mode inputs of the multiple mode access port, an output enable output, and a data output, a first tri-state buffer having a data input connected to the data output of the multiple mode access port, an enable input connected to the output enable output of the multiple mode access port, and a data output, a second tri-state buffer having a data input connected to the data output of the access port selector, an enable input connected to the output enable output of the access port selector, and a data output, a third tri-state buffer having a data input connected to the data outputs of the first and second tri-state buffers and a data output connected to the TDO output terminal.

Aspect 42 (FIG. 55)

An electrical device comprising:

a TDI input terminal, TMS input terminal, TCK input terminal, and TDO output terminal, a multiple mode access port having an input connected to the TDI input terminal, an input connected to the TMS input terminal, an input connected to the TCK input terminal, mode inputs, and a data output, an addressable access port selector having an input connected to the TDI input terminal, an input connected to the TMS input terminal, an input coupled to the TCK input terminal via an inverter, mode outputs connected to the mode inputs of the multiple mode access port, a control output, an address match output, and a data output, and;

a multiplexer having a data input connected to the data output of the multiple mode access port, a data input connected to the data output of the addressable access port selector, a control input connected to the control output of the addressable access port selector, and a data output coupled to the TDO output terminal.

Aspect 43 (FIG. 55)

The multiple mode access port of ASPECT 42 wherein the multiple mode access port operates as a JTAG test access port in response to a first mode input pattern.

Aspect 44 (FIG. 55)

The multiple mode access port of ASPECT 42 wherein the multiple mode access port operates as a JTAG complaint access port in response to a second mode input pattern.

Aspect 45 (FIG. 55)

The multiple mode access port of ASPECT 42 wherein the multiple mode access port operates as a JTAG compatible access port in response to a third mode input pattern.

Aspect 46 (FIG. 55)

The multiple mode access port of ASPECT 42 wherein the multiple mode access port operates as a non-JTAG access port in response to a fourth mode input pattern.

What is claimed is:

1. An integrated circuit comprising:
   A. a TDI input lead, TMS input lead, TCK input lead, TDO output lead, and TRST input lead;
   B. a first access port having an input connected to the TDI input lead, an input connected to the TMS input lead, an input connected to the TCK input lead, an enable input, a reset input, and a data output coupled to the TDO output lead;
   C. a second access port having an input connected to the TDI input lead, an input connected to the TMS input lead, an input connected to the TCK input lead, an enable input, a reset input, and a data output coupled to the TDO output lead;
   D. an inverter having an input connected to the TCK input lead and an output; and
   E. an access port selector having a port select register and a state machine controller, the port select register having an input coupled to the TDI input lead, control inputs, a first enable output connected to the enable input of the first access port, and a second enable output connected to the enable input of the second access port, the state machine controller having an input coupled to the TMS input lead, an input coupled to the output of the inverter, an input coupled to the TRST lead, a reset output coupled to the reset inputs of the first access port and the second access port, and control outputs connected to the control inputs of the port select register.

2. The integrated circuit of claim 1 in which the first test access port includes a data register, a bypass register, and an instruction register having inputs coupled to the TDI input lead, outputs coupled to the TDO output lead, and control inputs, the first test access port including a state machine controller having inputs coupled to the TMS input lead and the TCK input lead, and having control outputs connected to the data register, bypass register, and instruction register.

3. The integrated circuit of claim 1 in which the second test access port includes a data register, a bypass register, and an instruction register having inputs coupled to the TDI input lead, outputs coupled to the TDO output lead, and control inputs, the second test access port including a state machine controller having inputs coupled to the TMS input lead and the TCK input lead, and having control outputs connected to the data register, bypass register, and instruction register.

4. The integrated circuit of claim 1 in which the first test access port includes a data register, a bypass register, and an instruction register having inputs coupled to the TDI input lead, outputs coupled to the TDO output lead, and control inputs, the first test access port including a state machine controller having inputs coupled to the TMS input lead and the TCK input lead, and having control outputs connected to the data register, bypass register, and instruction register, the state machine controller having the states of TEST LOGIC RESET, RUN TEST/IDLE, SELECT-DR, CAPTURE-DR, SHIFT-DR, EXIT1-DR, PAUSE-DR, EXIR2-DR, and UPDATE-DR.

5. The integrated circuit of claim 1 in which the second test access port includes a data register, a bypass register, and an instruction register having inputs coupled to the TDI input lead, outputs coupled to the TDO output lead, and control inputs, the second test access port including a state machine controller having inputs coupled to the TMS input lead and the TCK input lead, and having control outputs connected to the data register, bypass register, and instruction register, the state machine controller having the states of TEST LOGIC RESET, RUN TEST/IDLE, SELECT-DR, CAPTURE-DR, SHIFT-DR, EXIT1-DR, PAUSE-DR, EXIR2-DR, and UPDATE-DR.

\* \* \* \* \*